(12) United States Patent
Yamaguchi et al.

(10) Patent No.: US 11,437,542 B2
(45) Date of Patent: Sep. 6, 2022

(54) METHOD OF MANUFACTURING LIGHT-EMITTING ELEMENT

(71) Applicant: NICHIA CORPORATION, Anan (JP)

(72) Inventors: Kazuki Yamaguchi, Tokushima (JP); Naoto Inoue, Anan (JP); Masaaki Shuto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 4 days.

(21) Appl. No.: 17/033,926

(22) Filed: Sep. 28, 2020

(65) Prior Publication Data

US 2021/0098647 A1 Apr. 1, 2021

(30) Foreign Application Priority Data

Sep. 30, 2019 (JP) .............................. JP2019-180260
May 27, 2020 (JP) .............................. JP2020-092549
Aug. 18, 2020 (JP) .............................. JP2020-138293

(51) Int. Cl.
    *H01L 33/00* (2010.01)

(52) U.S. Cl.
    CPC ................................ *H01L 33/0095* (2013.01)

(58) Field of Classification Search
    None
    See application file for complete search history.

(56) References Cited

U.S. PATENT DOCUMENTS

| | | | |
|---|---|---|---|
| 2005/0199592 A1* | 9/2005 | Iri ........................ | B23K 26/0617 219/121.6 |
| 2013/0029444 A1* | 1/2013 | Sato .................... | B23K 26/0006 438/33 |
| 2015/0217399 A1 | 8/2015 | Tajikara et al. | |
| 2017/0098733 A1 | 4/2017 | Tamemoto et al. | |
| 2018/0247871 A1 | 8/2018 | Inoue et al. | |

FOREIGN PATENT DOCUMENTS

| | | |
|---|---|---|
| JP | 2004-268104 | 9/2004 |
| JP | 2006-245062 | 9/2006 |
| JP | 2012-146874 | 8/2012 |
| JP | 2013-048207 | 3/2013 |
| JP | 2013-048244 | 3/2013 |

(Continued)

*Primary Examiner* — Bradley Smith
(74) *Attorney, Agent, or Firm* — Mori & Ward, LLP

(57) ABSTRACT

A method of manufacturing a light-emitting element includes condensing a laser beam inside a substrate provided with a semiconductor structure to form modified portions including first and second modified portions, including scanning the substrate along a predetermined planned cleavage line to form the first modified portions on the planned cleavage line inside the substrate and cracks generated from the first modified portions, and then scanning the substrate with a laser beam along a first predetermined imaginary line parallel to the planned cleavage line in a top view and is offset from the planned cleavage line in an in-plane direction of the substrate by a predetermined distance to perform second irradiation to form the second modified portions on the first predetermined imaginary line inside the substrate to facilitate development of the cracks generated from the first modified portions. The method then includes cleaving the substrate starting from the first modified portions.

22 Claims, 19 Drawing Sheets

(56) References Cited

FOREIGN PATENT DOCUMENTS

| | | |
|---|---|---|
| JP | 2013-247147 | 12/2013 |
| JP | 2014-041927 | 3/2014 |
| JP | 2014-241359 | 12/2014 |
| JP | 2016-129202 | 7/2016 |
| JP | 2016-129203 | 7/2016 |
| JP | 2017-069510 | 4/2017 |
| JP | 2018-050066 | 3/2018 |
| JP | 2018-142702 | 9/2018 |

* cited by examiner

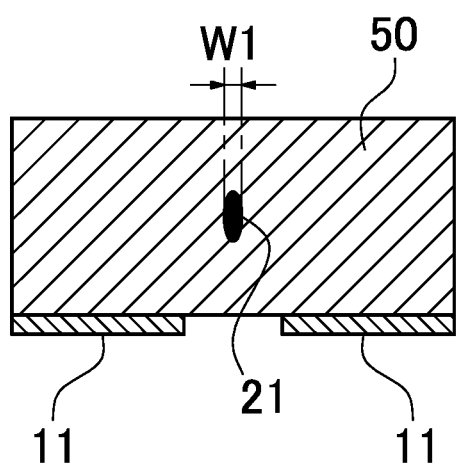 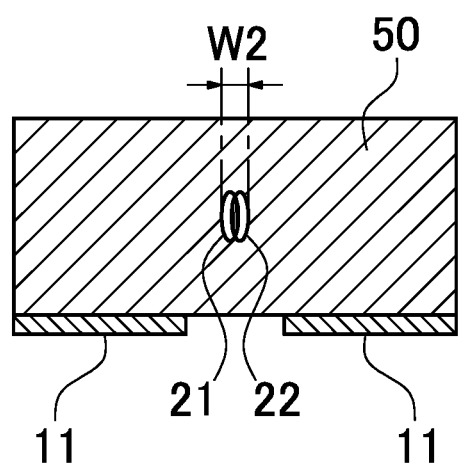

| COMPARATIVE EXAMPLE 3 | EXAMPLE 4 | EXAMPLE 6 |
|---|---|---|
| FIG. 11A | FIG. 11B | FIG. 11C |
| 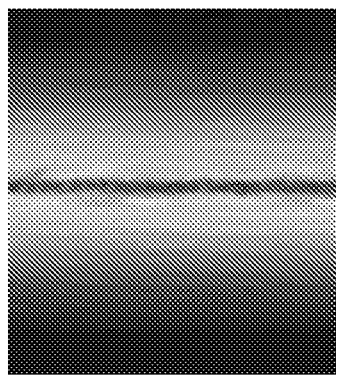 | 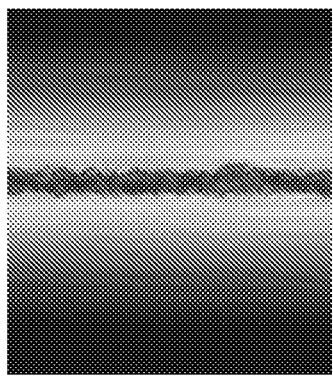 | 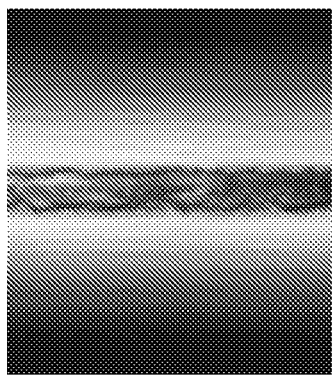 |
| FIG. 11D | FIG. 11E | FIG. 11F |
| 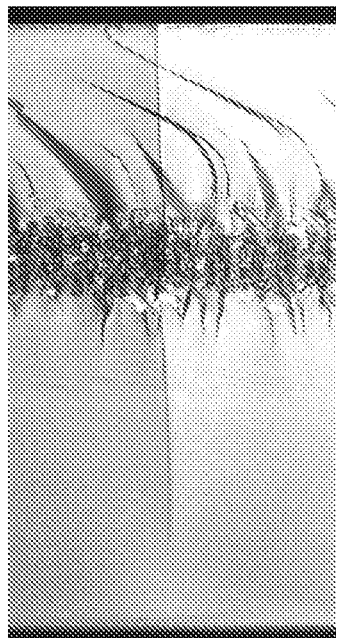 | 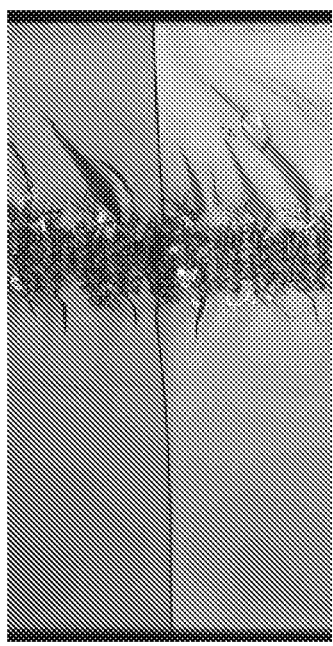 |  |

FIG. 14A
OFFSET + DIRECTION
FIG. 14B
OFFSET − DIRECTION
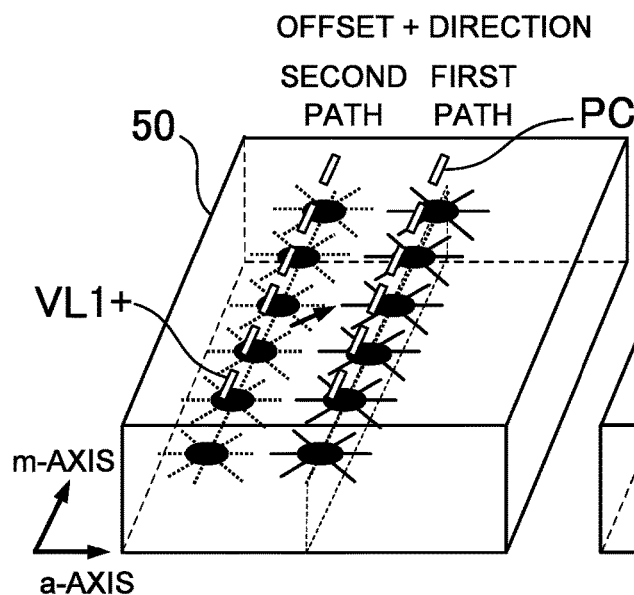
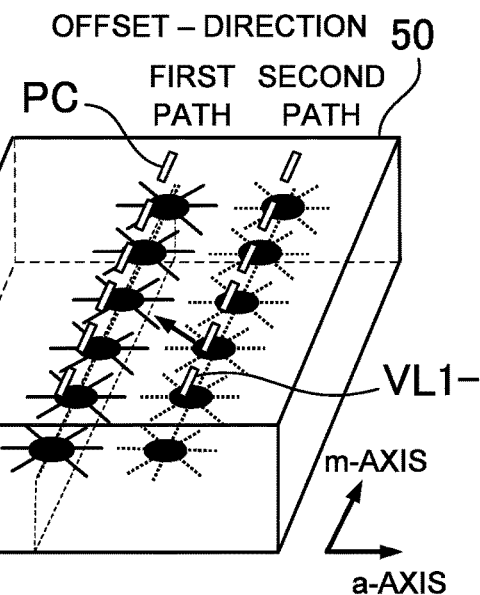
FIG. 15A
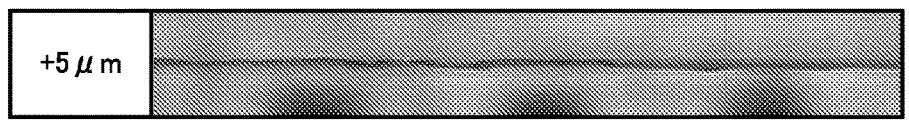
FIG. 15B
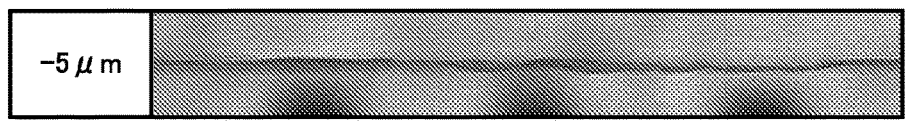

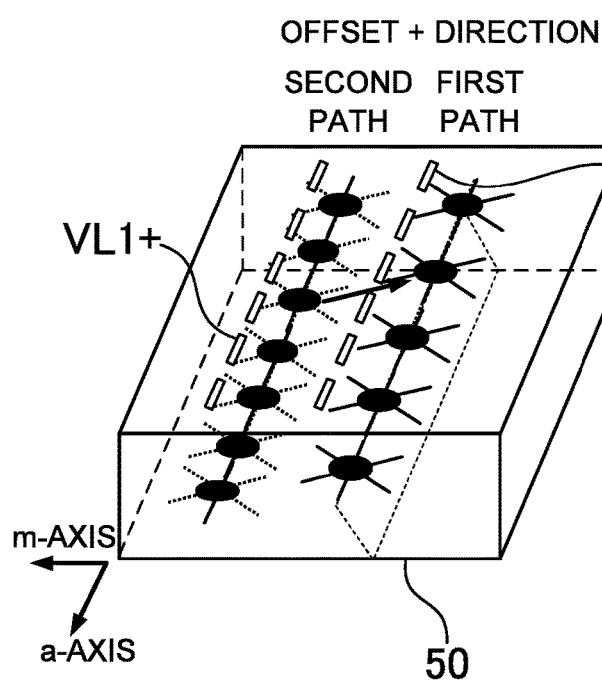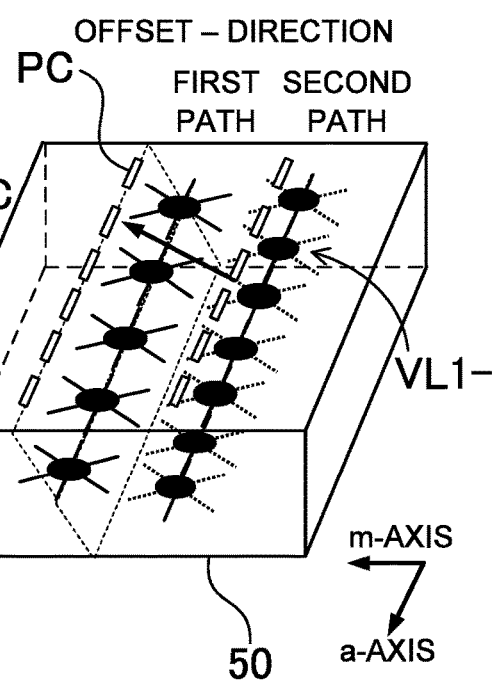

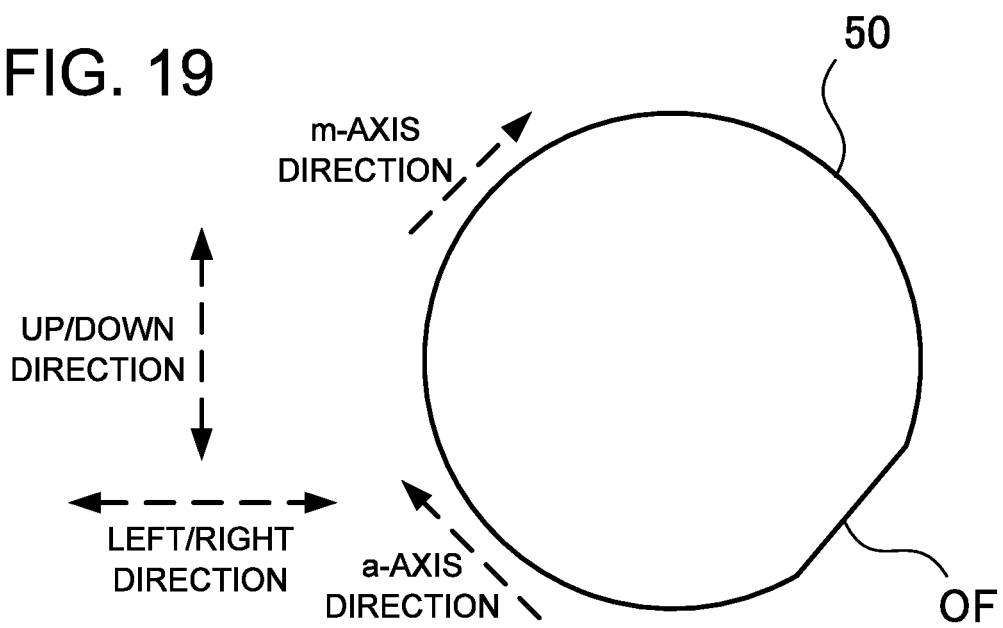

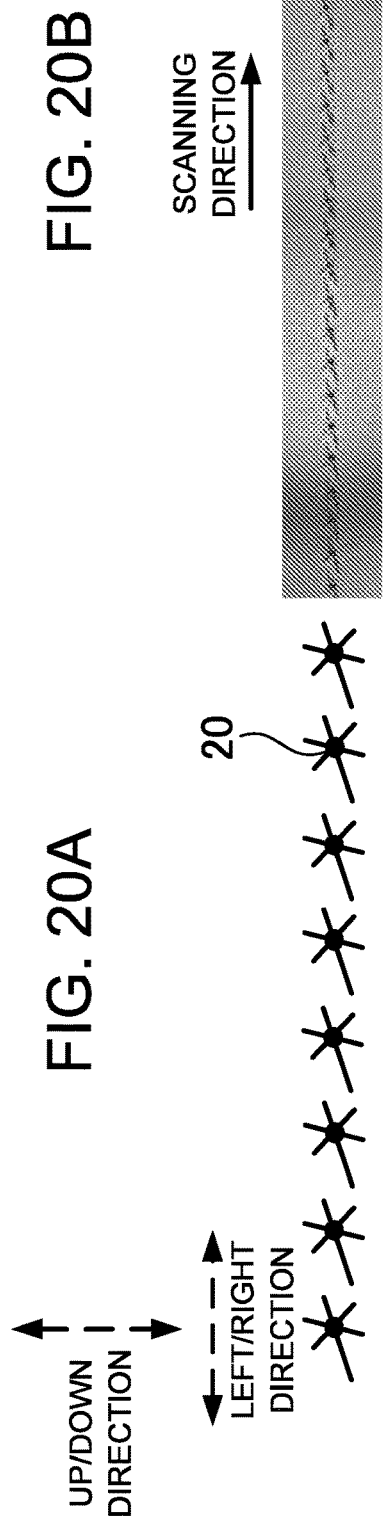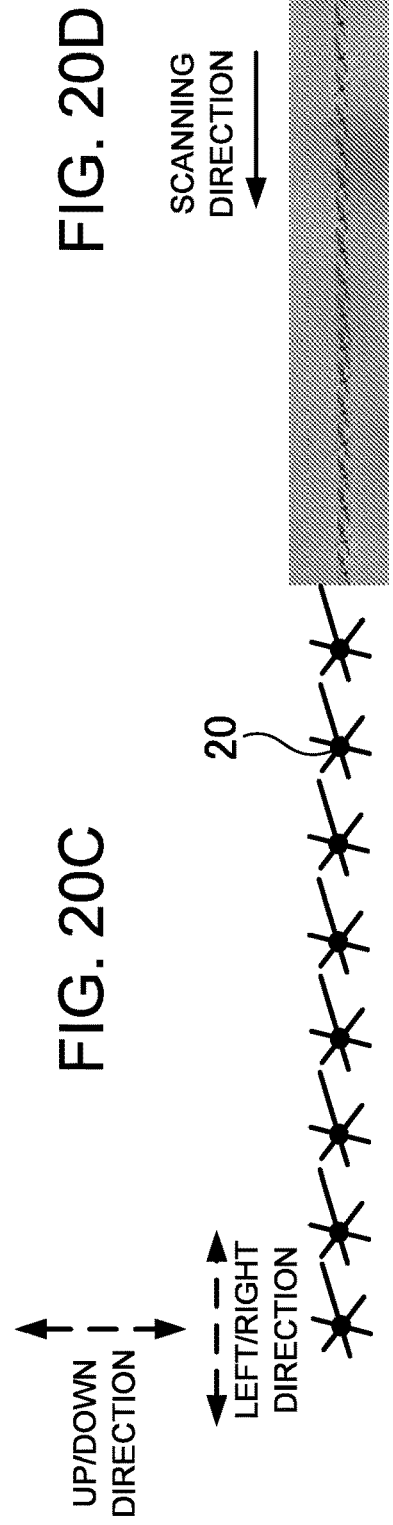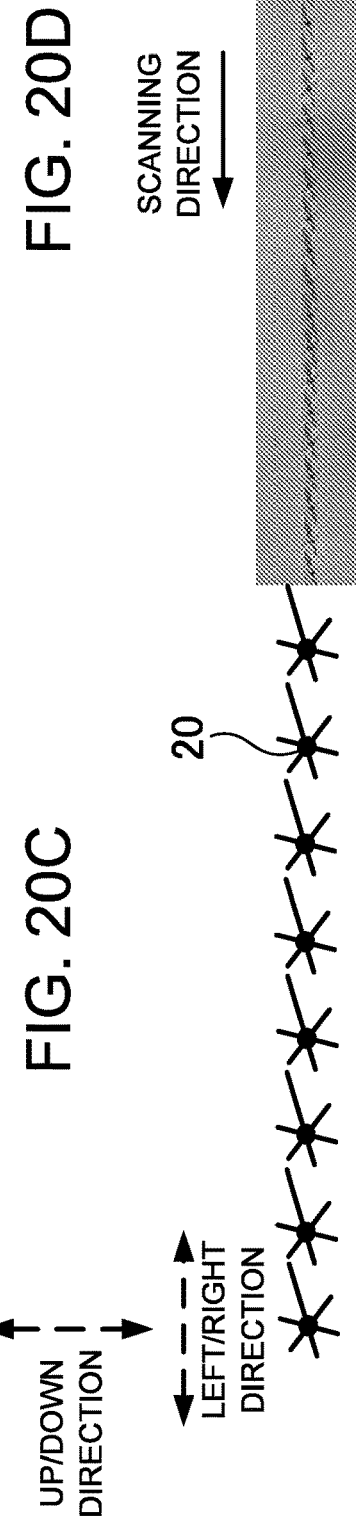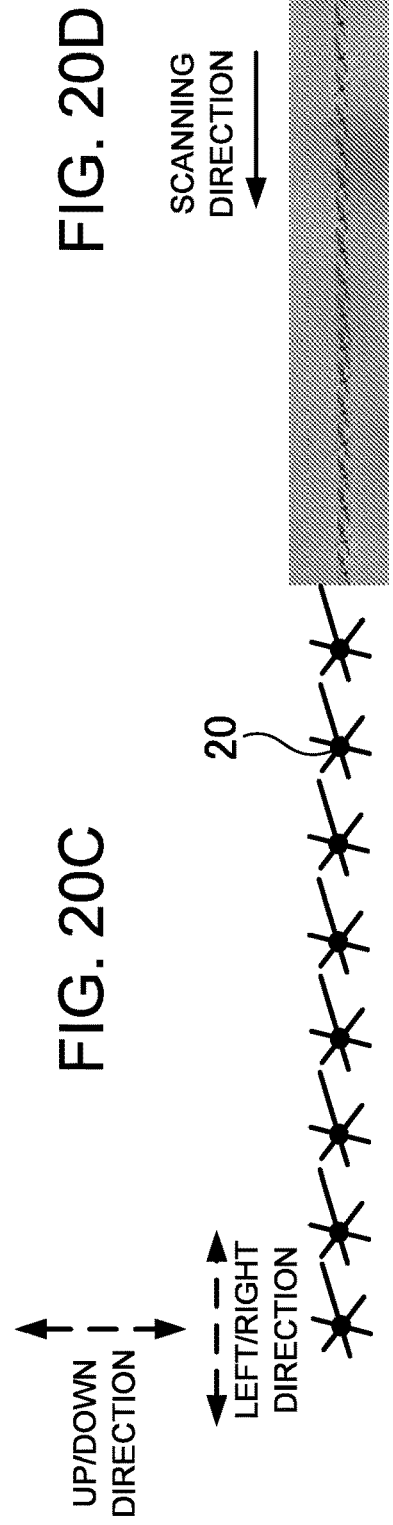

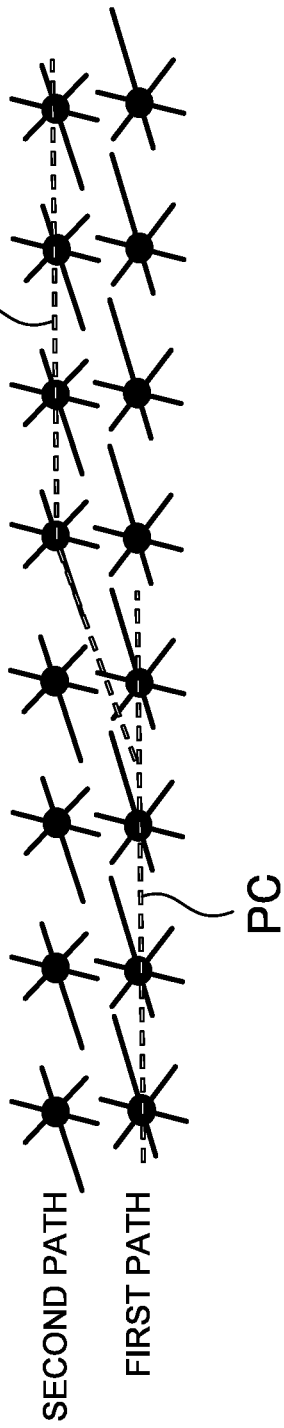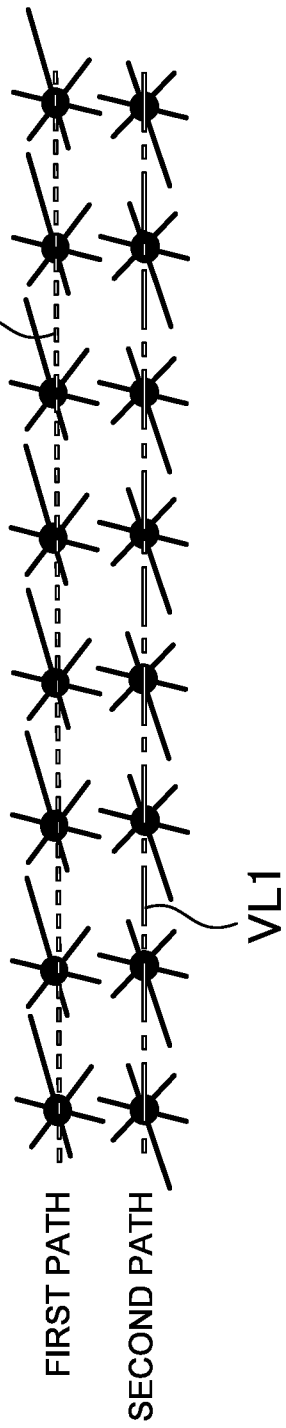

METHOD OF MANUFACTURING LIGHT-EMITTING ELEMENT

CROSS-REFERENCE TO RELATED APPLICATIONS

The present application claims priority under 35 U.S.C. § 119 to Japanese Patent Application No. 2019-180260, filed on Sep. 30, 2019, Japanese Patent Application No. 2020-092549, filed on May 27, 2020, and Japanese Patent Application No. 2020-138293, filed on Aug. 18, 2020. The contents of these applications are incorporated herein by reference in their entirety.

BACKGROUND OF THE INVENTION

1. Field of the Invention

The present disclosure relates to a method of manufacturing a light-emitting element.

2. Description of Related Art

Semiconductor light-emitting elements are small, have high power efficiency, and emit light having vivid colors. The semiconductor light-emitting elements also exhibits good initial drive performance and high durability to vibration and repetitive operations of turning on and off. This allows semiconductor light-emitting elements such as light-emitting diodes (hereinafter also referred to as "LEDs") and laser diodes to be used for various light sources, and further improvements in the light output and light-emission efficiency are demanded.

Such semiconductor light-emitting elements can be obtained by epitaxially growing a semiconductor layer on a substrate such as a sapphire substrate and then singulating. For example, Japanese Unexamined Patent Application Publication No. 2006-245062 describes a method of dividing a sapphire substrate provided with semiconductor layers by irradiating the sapphire substrate with a laser beam from the back side of the sapphire substrate to form a modified area inside the sapphire substrate, generating a crack from the modified area to perform cleavage. When a thickness of the sapphire substrate is increased, forming only a single modified area inside the sapphire substrate may result in insufficient cleavage. Accordingly, a method in which two or three or more modified areas are formed in the thickness direction of the sapphire substrate by additional laser irradiation to perform cleavage has been proposed.

When a plurality of modified areas are formed in the thickness direction of the sapphire substrate, the laser beam is condensed at a position close to the semiconductor layer, so that the laser beam may deteriorate the semiconductor layer. On the other hand, forming only a single modified area in the thickness direction of the substrate may result in insufficient cleavage, as described above. There is a trade-off between the cleavability of the sapphire substrate and reduction of deterioration of the semiconductor layer as described above, and it is difficult to obtain both.

The present invention has been made to solve such problems. Embodiments of the present invention advantageously provide a method of manufacturing a light-emitting element in which the ease of cleaving a substrate has been improved.

SUMMARY OF THE INVENTION

A method of manufacturing a light-emitting element according to an embodiment of the present invention includes condensing a laser beam inside a substrate provided with a semiconductor structure to form a plurality of modified portions including a plurality of first modified portions and a plurality of second modified portions, the condensing the laser beam including scanning the substrate with a laser beam along a predetermined planned cleavage line to perform first irradiation to form the plurality of first modified portions located on the planned cleavage line inside the substrate and cracks generated from the first modified portions, and after the first irradiation, scanning the substrate with a laser beam along a first predetermined imaginary line that is parallel to the planned cleavage line in a top view and is offset from the planned cleavage line in an in-plane direction of the substrate by a predetermined distance to perform second irradiation to form the plurality of second modified portions located on the first predetermined imaginary line inside the substrate to facilitate development of the cracks generated from the first modified portions; and, after the condensing the laser beam, cleaving the substrate starting from the plurality of first modified portions.

In the method of manufacturing a light-emitting element according to an embodiment of the present invention, the second modified portions are formed along the first predetermined imaginary line different from the planned cleavage line, and development of the cracks generated from the first modified portions can be facilitated, so that the substrate can be easily cleaved.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6A is a schematic cross-sectional view of the substrate in FIG. 5A;

FIG. 6B is a schematic cross-sectional view of the substrate in FIG. 5B;

FIG. 11A is a plan-view photograph of a modified area in a substrate irradiated with a laser beam in the method according to Comparative Example 3;

FIG. 11B is a plan-view photograph of a modified area in a substrate irradiated with a laser beam in the method according to Example 4;

FIG. 11C is a plan-view photograph of a modified area in a substrate irradiated with a laser beam in the method according to Example 6;

FIG. 11D is a photograph of a cross-section of the substrate shown in FIG. 11A;

FIG. 11E is a photograph of a cross-section of the substrate shown in FIG. 11B;

FIG. 11F is a photograph of a cross-section of the substrate shown in FIG. 11C;

FIG. 14A is a schematic perspective view of an example in which a first predetermined imaginary line is set to extend on a left side with respect to the planned cleavage line;

FIG. 14B is a schematic perspective view of an example in which the first predetermined imaginary line is set to extend on a right side with respect to the planned cleavage line;

FIG. 15A is a micrograph of a surface of a substrate in an example in which the first predetermined imaginary line is +5 μm offset from the planned cleavage line.

FIG. 15B is a micrograph of a surface of a substrate in an example in which the first predetermined imaginary line is −5 μm offset from the planned cleavage line;

FIG. 16A is a schematic perspective view of an example in which a second path is offset from a first path in the + direction;

FIG. 16B is a schematic perspective view of an example in which the second path is offset from the first path in the − direction;

FIG. 19 is a schematic plan view of a substrate with an orientation flat surface of the substrate inclined at an angle of 45° relative to the horizontal plane;

FIG. 20A is a schematic enlarged plan view showing the shape of marks resulting from scanning in a substrate with a pulsed laser beam from left to right in the left-right direction;

FIG. 20B is a micrograph of the substrate subjected to the scan shown in FIG. 20A;

FIG. 20C is a schematic enlarged plan view showing the shape of marks resulting from scanning in a substrate with a pulsed laser beam from right to left in the left-right direction;

FIG. 20D is a micrograph of the substrate subjected to the scan shown in FIG. 20C;

FIG. 21A is a schematic enlarged plan view showing development of cracks resulting from scanning with a laser beam in the left-right direction and a subsequent scan with the laser beam with an upward offset;

FIG. 21B is a schematic enlarged plan view showing development of cracks resulting from scanning with a laser beam in the left-right direction and then scanning with the laser beam with a downward offset;

DETAILED DESCRIPTION OF EMBODIMENTS

Figure 1:
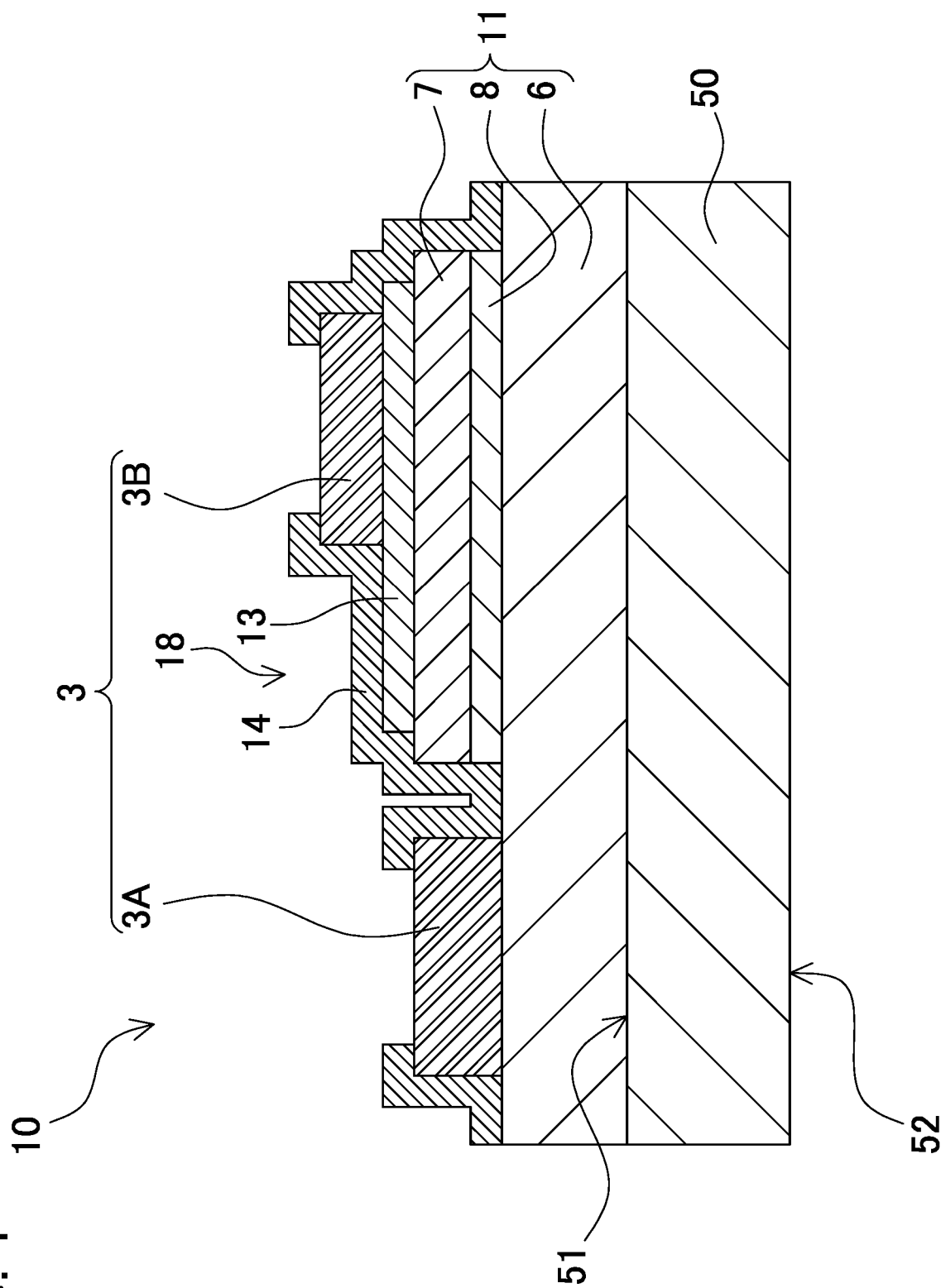
FIG. 1 is a schematic cross-sectional view of a light-emitting element obtained using a method of manufacturing according to a first embodiment.

Certain embodiments of the present invention will be described in detail on the basis of drawings. The embodiments and examples below illustrate a method of manufacturing a light-emitting element to embody the technical ideas of the present invention, but the scope of the present invention is not intended to be limited thereto. Unless specifically stated otherwise, in particular, the sizes, materials, shapes, and relative positions of components described referring to the examples are not intended to limit the scope of the present invention thereto but are intended to provide examples for illustration. Sizes or positional relationships of members illustrated in the drawings may be exaggerated in order to clarify the descriptions. In the descriptions below, the same term or reference numeral represents the same member or a member made of the same material, and its detailed description may be omitted when appropriate. As for each element in embodiments of the present invention, a plurality of elements may be formed of a single member so that the single member serves as the plurality of elements, or conversely, a combination of a plurality of members may serve as a single member. In the present specification, the term "on" as used in a context such as "on a layer" is not necessarily limited to the case in which something is formed in contact with an upper surface of a component but also implies the case in which something is formed above and apart from the upper surface, such as the case in which an intervening layer exists between two layers. Some constitutions described in some of the examples or embodiments may be applicable to other examples or embodiments. The descriptions below include terms indicating specific directions or positions (for example, "up", "down", and other terms inclusive of these terms) as appropriate. Use of these terms is intended to facilitate understanding of the present invention with reference to the drawings, and the meanings of these terms do not limit the technical scope of the present invention. The term "include" as used in the present specification refers to both of inclusion as a separate member and inclusion as an integrated member.

Light-Emitting Element 10

FIG. 1 is a schematic cross-sectional view of a light-emitting element 10 obtained using a method of manufacturing according to a first embodiment of the present invention. The light-emitting element 10 shown in FIG. 1 is a face-up type LED, which is one example of nitride semiconductor elements. The light-emitting element 10 will be described below in detail.

In the light-emitting element 10 shown in FIG. 1, a semiconductor structure 11 including a plurality of nitride semiconductor layers is disposed on a first main surface 51, which is one of a pair of opposite main surfaces of a substrate 50. More specifically, the light-emitting element 10 includes, on the first main surface 51 of the substrate 50, the semiconductor structure 11 including an n-type semiconductor layer 6, an active region 8, and a p-type semiconductor layer 7 located in this order from the first main surface 51 side. An n-side pad electrode 3A electrically connected to the n-type semiconductor layer 6 is disposed on the n-type semiconductor layer 6. A light-transmissive conductive layer 13 is disposed on the p-type semiconductor layer 7. A p-side pad electrode 3B electrically connected to the p-type semiconductor layer 7 via the light-transmissive conductive layer 13 is disposed on the light-transmissive conductive layer 13. Further, an insulating protective film 14 covers a surface of the semiconductor structure 11 and the surfaces of the n-side pad electrode 3A and the p-side pad electrode 3B. The surfaces of the n-side pad electrode 3A and the p-side pad electrode 3B are partially exposed from the protective film 14. When electricity is supplied from an external device to the light-emitting element 10 through each of the n-side pad electrode 3A and the p-side pad electrode 3B, the active region 8 emits light, and the light is extracted mainly from the surface provided with the electrodes shown in FIG. 1. That is, in the light-emitting element 10 shown in FIG. 1, the surface provided with the n-side pad electrode 3A and the p-side pad electrode 3B is a main light-extracting surface 18. Components of the light-emitting element 10 will be specifically described below.

Substrate 50

For the substrate 50, a substrate of any appropriate size and thickness of can be used as long as the semiconductor structure 11 can be epitaxially grown on the substrate. In the case in which a nitride semiconductor is epitaxially grown to be the semiconductor structure 11, an insulating substrate made of sapphire in which any of the C-plane, the R-plane, and the A-plane constitutes the main surface can be used as the substrate 50.

Semiconductor Structure 11

A nitride semiconductor represented by the general formula $In_xAl_yGa_{1-x-y}N$ (where $0 \leq x$, $0 \leq y$, and $x+y \leq 1$) can be used for the semiconductor structure 11. The semiconductor structure 11 includes the active region 8, which is a light-emitting layer. The active region 8 can have a single or multiple quantum well structure. The peak wavelength of light emitted from the active region 8 can be in the range of 360 nm or more and 650 nm or less, preferably 380 nm or more and 560 nm or less. The n-type semiconductor layer 6 may contain an n-type impurity such as Si or Ge. The p-type semiconductor layer 7 may contain a p-type impurity such as Mg or Zn. The concentration of impurities contained in a nitride semiconductor is preferably $5 \times 10^{16}/cm^3$ or more and $5 \times 10^{21}/cm^3$ or less.

Light-Transmissive Conductive Layer 13

The light-transmissive conductive layer 13 is disposed on the p-type semiconductor layer 7 as shown in FIG. 1. Disposing the light-transmissive conductive layer 13 on the p-type semiconductor layer 7 allows an electric current to spread over a relatively large area of the p-type semiconductor layer 7.

For example, the light-transmissive conductive layer 13 can be made of an oxide containing at least one element selected from the group consisting of Zn, In, and Sn. More specifically, it is desirable that the light-transmissive conductive layer 13 contain an oxide of Zn, In, or Sn, such as ITO, ZnO, $In_2O_3$, or $SnO_2$, preferably ITO. With the use of such a material, such a light-transmissive conductive layer 13 can transmit light emitted from the active region 8 and can have good ohmic contact for spreading an electric current with the semiconductor structure.

Electrodes 3

The n-side pad electrode 3A and the p-side pad electrode 3B are electrically connected to the n-type semiconductor layer 6 and the p-type semiconductor layer 7, respectively. For example, the n-side pad electrode 3A and the p-side pad electrode 3B can be made of Au or an alloy mainly composed of Au.

Protective Film 14

The protective film 14 covers at least an upper surface of the n-type semiconductor layer 6 and an upper surface of the p-type semiconductor layer 7. The protective film 14 has an n-side opening in the upper surface of the n-type semiconductor layer 6 and a p-side opening in the upper surface of the p-type semiconductor layer 7. The protective film 14 also covers lateral surfaces of the n-type semiconductor layer 6 and lateral surfaces of the p-type semiconductor layer 7. In particular, with the protective film 14 continuously covering the lateral surfaces of the n-type semiconductor layer 6, the lateral surfaces of the active region 8, and the lateral surfaces of the p-type semiconductor layer 7, generation of leakage current can be prevented. The protective film 14 can have any appropriate thickness that allows for protecting the semiconductor layers, and is preferably, for example, 10 nm or more and 1,000 nm or less, more preferably 100 nm or more and 300 nm or less.

Method of Manufacturing Light-Emitting Element

In the method of manufacturing a light-emitting element, the substrate 50 that is made of sapphire and has the first main surface 51 and a second main surface 52 is provided. The substrate 50 has a substantially circular shape in a plan view and has an orientation flat surface OF at a portion of a periphery thereof. The A-plane or the C-plane preferably constitutes the orientation flat surface OF. For the substrate 50, a sapphire substrate in which the C-plane (0001) constitutes the first main surface 51 and in which the A-plane (11-20) constitutes the orientation flat surface OF is preferably used. The thickness of the substrate 50 is preferably, for example, 100 μm or more and 800 μm or less, more preferably 100 μm or more and 300 μm or less.

The present invention can be preferably used for a sapphire substrate, which is difficult to cleave, as described above. An example in which a sapphire substrate is used for the substrate 50 will be described below.

Forming Semiconductor Layers

The semiconductor structure 11 is formed on the first main surface 51 of the substrate 50. The semiconductor structure 11 includes a plurality of semiconductor layers. Any appropriate method can be employed for growing the semiconductor layers. Any appropriate methods known as methods for growing semiconductors, such as metalorganic vapor phase epitaxy (MOVPE) method, metal organic chemical vapor deposition (MOCVD) method, hydride vapor phase epitaxy (HYPE), or molecular beam epitaxy (MBE) method can be preferably employed. In particular, using MOCVD method allows for growing semiconductor layers with high crystallinity, and thus is preferable.

Cleaving

Figure 2:
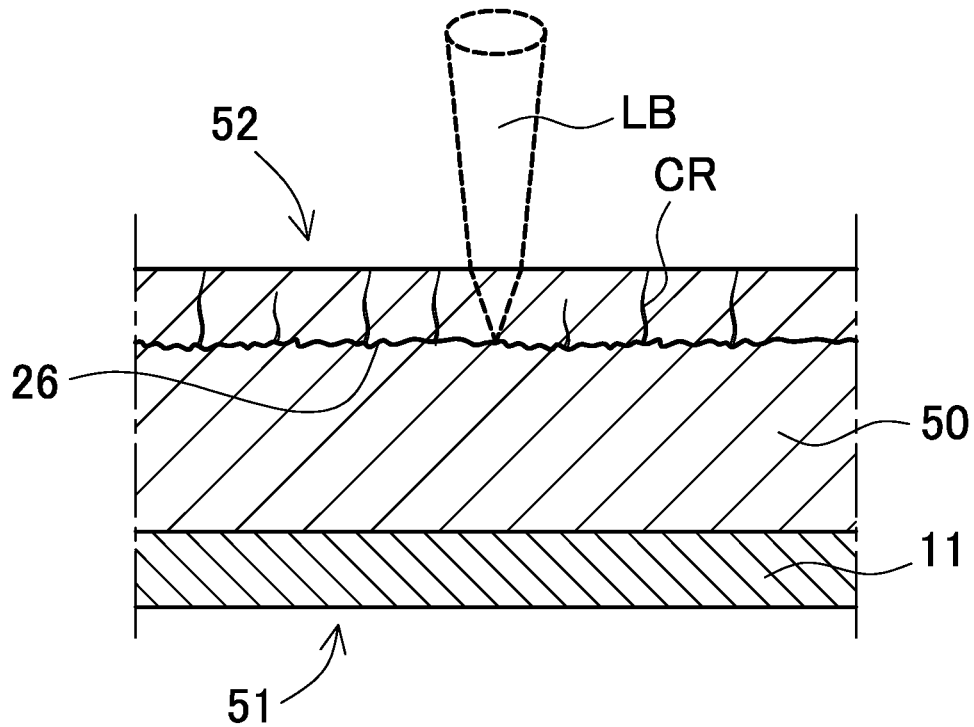
FIG. 2 is a schematic cross-sectional view showing cleavage for dividing a substrate into light-emitting elements.

After the semiconductor structure 11 is grown on the first main surface 51 of the substrate 50, the substrate 50 is ground to have a thickness of, for example, about 100 μm or more and 300 μm or less. After that, a laser beam is condensed at inner portions of the substrate 50 to partially embrittle the substrate 50, so that a portion of the substrate 50 is modified. The schematic cross-sectional view of FIG. 2 shows a scan pattern of the laser beam in a cross-sectional view. As shown in FIG. 2, a laser beam LB is irradiated to the inside of the substrate 50 from the second main surface 52 side of the substrate 50. Irradiation of the laser beam LB causes modification of the irradiated region, so that modified portions 20 are formed. Cracks CR generate from the modified portions 20 toward the first main surface 51 and the second main surface 52 of the substrate 50. Scanning with the laser beam LB in the plane of the substrate 50 to form plurality of modified portions 20 results in formation of a modified line 26 composed of the modified portions 20 of a linear shape. By applying a stress to the substrate 50, the substrate 50 is cleaved, the cleavage starting from the modified portions 20 and the cracks CR.

Figure 3:
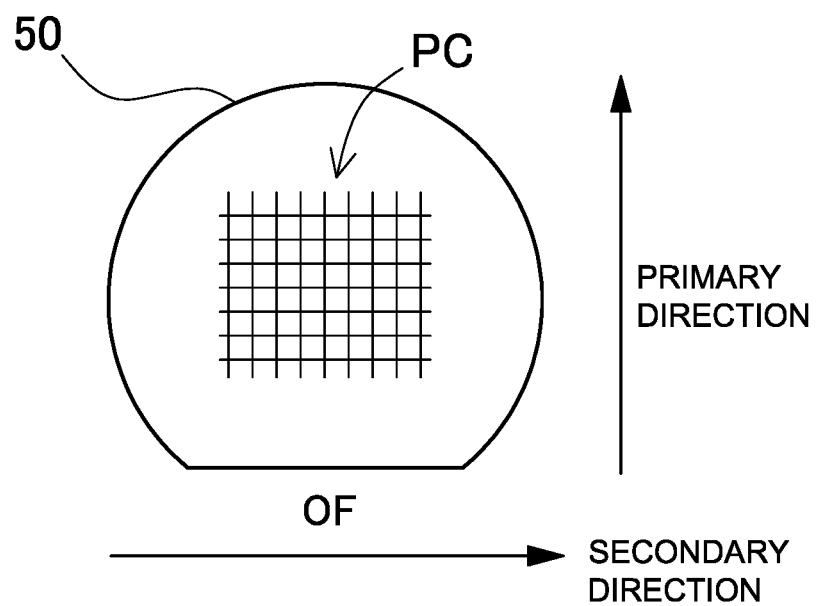
FIG. 3 is a schematic plan view showing scanning directions of a laser beam relative to the substrate.
Figure 4:
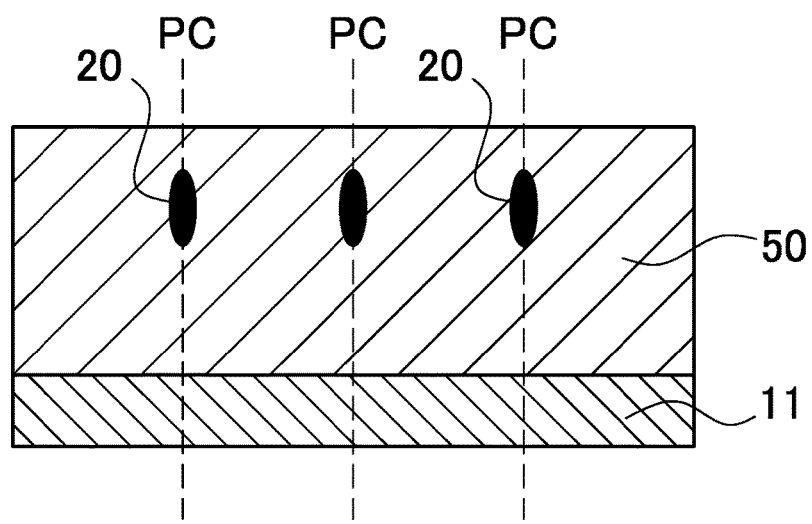
FIG. 4 is a schematic cross-sectional view in which modified portions have been formed along a plurality of planned cleavage lines.

While the laser beam is condensed inside the substrate 50, scans are performed along a plurality of planned cleavage lines PC shown in FIG. 3 along which cleavage is to be performed at the time of singulation. Scans with the laser beam LB are performed along a primary direction substantially perpendicular to the orientation flat surface OF and a secondary direction substantially parallel to the orientation flat surface OF in a top view as shown in FIG. 3. For example, scans with the laser beam in the primary direction are performed, and scans in the secondary direction are then performed. By performing scans with the laser beam along a plurality of planned cleavage lines PC, modified portions 20 are formed along the planned cleavage lines PC as shown in the schematic cross-sectional view of FIG. 4. The substrate 50 is then cleaved along the planned cleavage lines PC to separate into a plurality of singulated light-emitting elements.

When a thickness of the substrate 50 is increased, the cracks CR may not sufficiently propagate in the method described above, which may result in difficulty in cleavage of the substrate 50. Increasing the output power of the laser beam LB to further facilitate development of the cracks CR may be considered, but excessive increase of output power of the laser beam LB may lead to deterioration of the semiconductor layers on the substrate 50 due to heat or the like generated by the laser beam LB.

First Embodiment

Figure 5A:
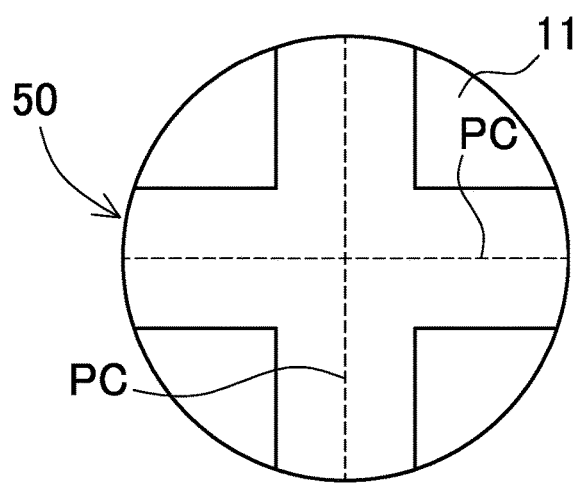
FIG. 5A is a schematic plan view showing repeated irradiation of the same position of a substrate with the laser beam multiple times in a method according to a comparative example.
Figure 5B:
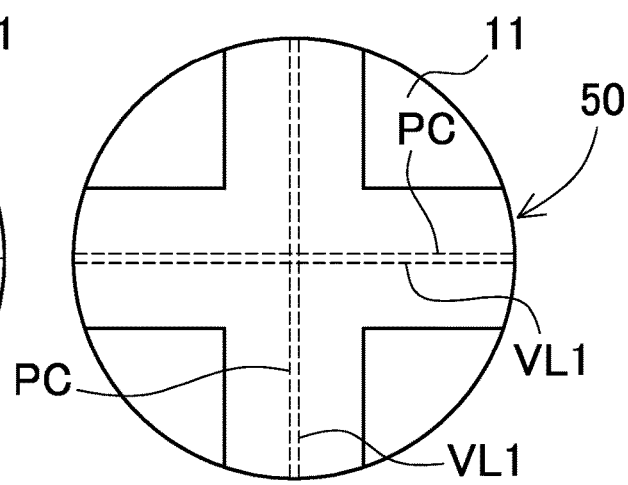
FIG. 5B is a schematic plan view showing irradiation at scanning positions that are different between different scans in a method according to the first embodiment.

As a result of intensive studies, the present inventors have found that development of the cracks CR is enhanced by devising an appropriate arrangement of positions to be irradiated with the laser beam LB, and the present inventors have thus made the present invention. More specifically, not only first modified portions 21 are formed by irradiation with a laser beam along each planned cleavage line PC as shown in FIG. 5A, but also second modified portions 22 are formed inside the substrate 50 by irradiation with the laser beam along a first predetermined imaginary line VL1 offset from each planned cleavage line PC by a predetermined distance as shown in FIG. 5B. The schematic cross-sectional views of FIG. 6A and FIG. 6B show positions to be irradiated with the laser beam. FIG. 6A schematically shows an irradiation pattern of a comparative example corresponding to FIG. 5A, and FIG. 6B schematically shows an irradiation pattern according to the first embodiment corresponding to FIG. 5B. In irradiation with the laser beam according to the first embodiment, a laser beam is irradiated along the planned cleavage line PC and the first predetermined imaginary line VL1 as shown in FIG. 5B, at positions that are the same in the thickness direction as shown in FIG. 6B. With this operation, development of the cracks CR from the first modified portions 21 formed along the planned cleavage line PC is facilitated, so that the substrate 50 can be efficiently cleaved.

Generation of cracks from the modified portions 20 is generally caused by release of strains caused when the modified portions 20 are formed. However, in the case in which new modified portions 20 are formed near a region in which modified portions 20 and the resulting cracks have already been formed, forces produced when the strains are released are assumed to hardly contribute to formation of new cracks but mainly act on the existing cracks. That is, in the first embodiment, forces produced when the strains caused by formation of the second modified portions 22 are released acts on the existing cracks CR generated from the first modified portion 21, which is assumed to facilitate development of the cracks CR.

The second modified portions 22 are formed by irradiation with the laser beam at positions offset from the planned cleavage line PC, so that a width W2 of a resulting modified area in the first embodiment shown in FIG. 6B is larger than a width W1 of a modified area in the comparative example shown in FIG. 6A.

Cleaving of such a substrate 50 will be described below. A first irradiation in which the laser beam LB is scanned along the planned cleavage lines PC is performed to form a plurality of first modified portions 21 on the planned cleavage lines PC inside the substrate 50 and crack generated from the first modified portions 21. After the first irradiation, a second irradiation in which the laser beam is scanned along the first predetermined imaginary lines VL1 is performed such that each of the first predetermined imaginary lines VL1 is parallel to a corresponding one of the planned cleavage lines PC in a top view of the substrate 50 and is offset from the planned cleavage line PC in an in-plane direction of the substrate 50 by a predetermined distance. A plurality of second modified portions 22 located on the first predetermined imaginary lines VL1 are thus formed inside the substrate 50, so that development of cracks generated from the first modified portions 21 can be facilitated. After that, the substrate 50 is cleaved starting from the first modified portions 21.

The output power of the laser beam in the second irradiation is preferably equal to or higher than the output power of the laser beam in the first irradiation. This structure allows for increasing forces produced by release of strains caused when the second modified portions 22 are formed, so that development of cracks from the first modified portions 21 can be easily facilitated.

Each of the first predetermined imaginary lines VL1 is preferably 3 μm or more and 7 μm or less offset from a corresponding one of the planned cleavage lines PC in the in-plane direction of the substrate. With the offset distance of 3 μm or more of the first predetermined imaginary line VL1 from the planned cleavage line PC in the in-plane direction of the substrate, development of cracks from the first modified portions 21 can be efficiently facilitated. With the offset distance of 7 µm or less of the first predetermined imaginary line VL1 from the planned cleavage line PC in the in-plane direction of the substrate, generation of cracks from the second modified portions 22 is reduced while development of the cracks CR from the first modified portion 21 is enhanced.

The positions in which the laser beam is condensed in the second irradiation are preferably approximately the same in the thickness direction of the substrate as the positions in which the laser beam is condensed in the first irradiation. This structure allows the second modified portions 22 to effectively facilitate the above-described development of the cracks CR from the first modified portion 21.

Various lasers such as a pulsed laser or a continuous wave laser that can cause multiphoton absorption can be used to emit the laser beam LB. For example, the pulse width of a pulsed laser beam is 100 fsec to 1,000 psec. A peak wavelength with which the laser beam can be transmitted through the sapphire substrate 50 is selected as the peak wavelength of the laser beam. For example, the peak wavelength of the laser beam is 350 nm or more and 1,100 nm or less. Examples of a laser of a wavelength with which the laser beam can be transmitted through the sapphire substrate 50 include Nd:YAG lasers, Yb:YAG lasers, Nd:YVO$_4$ lasers, Nd:YLF lasers, Ti:sapphire lasers, and KGW lasers. The spot size of the laser beam is, for example, 1 µm or more and 10 µm or less.

Figure 22:
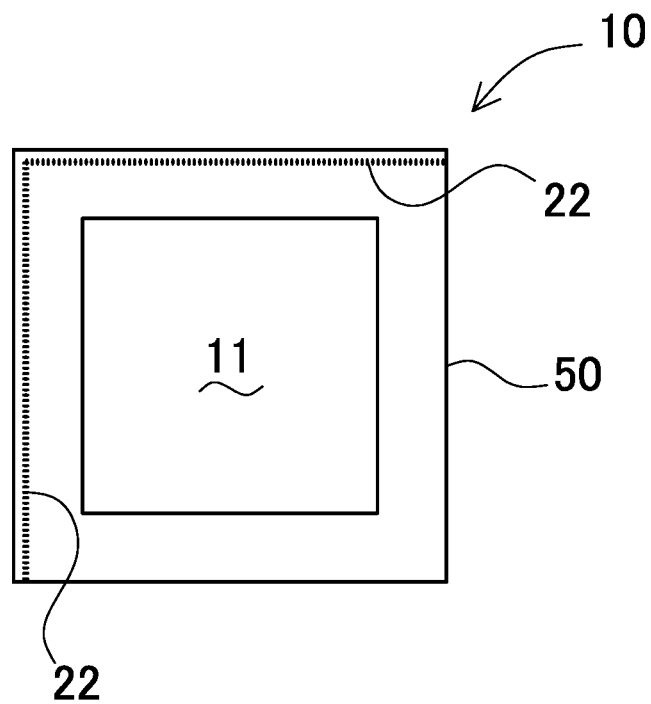
FIG. 22 is a schematic plan view of a light-emitting element singulated from the substrate in FIG. 5B.

FIG. 22 is a schematic plan view of the light-emitting element 10 obtained by singulation by cleaving the substrate 50 shown in FIG. 5B along the planned cleavage lines PC. The light-emitting element 10 in FIG. 22 is the lower right light-emitting element in FIG. 5B. The second modified portions are formed along portions of the four sides defining the periphery of such a singulated rectangular light-emitting element 10 in a plan view. In FIG. 22, the second modified portions 22 are formed along the upper and left sides, which are adjacent to each other, of the rectangular shape.

Figure 23:
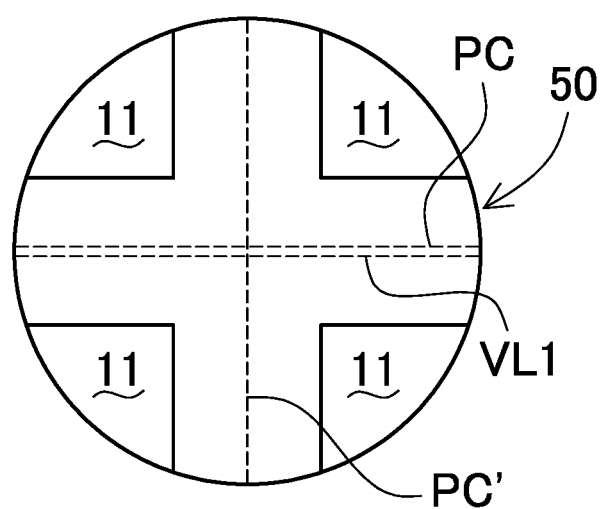
FIG. 23 is a schematic plan view showing another example of positions to be irradiated with the laser beam.
Figure 24:
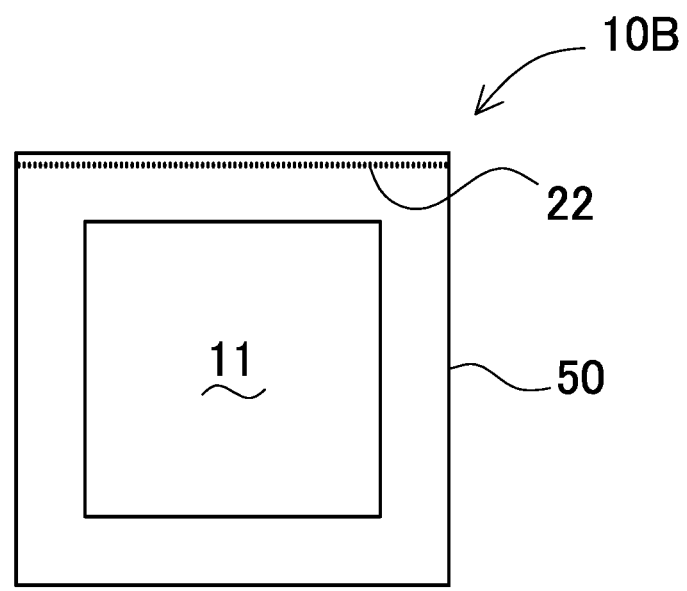
FIG. 24 is a schematic plan view of a light-emitting element singulated from a substrate in FIG. 23.

In the example described referring to FIG. 5B, the second modified portions 22 are formed by irradiation with the laser beam on the first predetermined imaginary lines VL1 each of which runs along a corresponding one of the planned cleavage lines PC used for cleaving the substrate 50 in the longitudinal and lateral directions. The present invention encompasses other appropriate manner of operations. For example, the second modified portions 22 may be formed in only one of the longitudinal and lateral directions in which scans with the laser beam are performed. FIG. 23 is a schematic plan view of such an example. In this example, the first predetermined imaginary line VL1 is set to extend along the planned cleavage line PC extending in the lateral direction of the drawing, and scans with the laser beam are performed on the planned cleavage line PC and the first predetermined imaginary line VL1 to form the first modified portions 21 and the second modified portions 22. In the longitudinal direction, a scan with the laser beam is performed only on the planned cleavage line PC' to form only the first modified portions 21. A light-emitting element 10B singulated by cleaving the substrate 50 on which scans with the laser beam have been performed has the second modified portions 22 along only one side (the upper side in FIG. 24) of the four sides as shown in the schematic plan view of FIG. 24.

Figure 25:
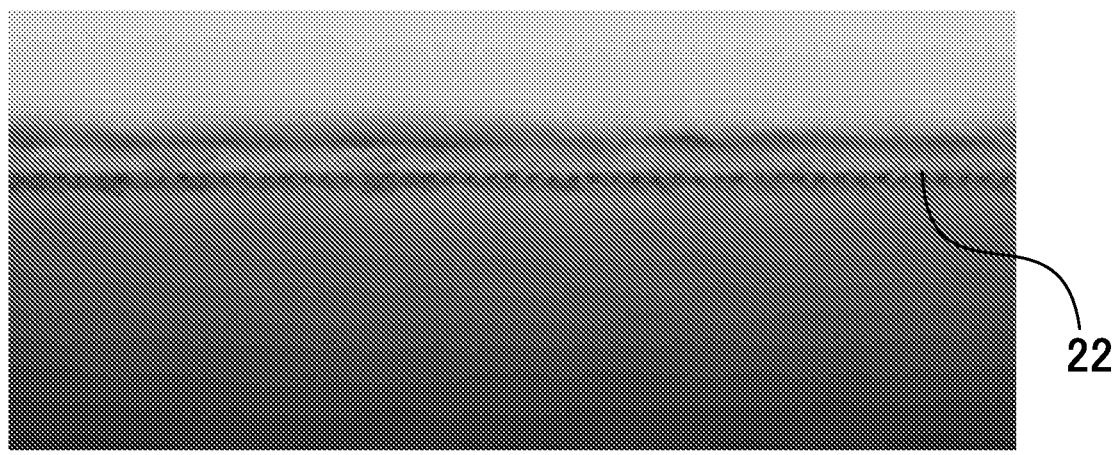
FIG. 25 is an enlarged photograph of the singulated light-emitting element.

FIG. 25 is an enlarged photograph of one example of the resulting light-emitting element 10. FIG. 25 is an enlarged photograph of a portion of the upper side in the periphery of the light-emitting element 10 shown in FIG. 22. A sapphire substrate was used for the substrate 50. A femtosecond laser with a pulse width of 700 fs was used to produce the laser beam. The output powers of the laser beam were 0.15 Win the first irradiation and 0.25 Win the second irradiation. The offset distance between the first irradiation and the second irradiation was 6 µm. FIG. 25 is an optical micrograph of the light-emitting element 10 obtained by cleaving the substrate 50 when viewed from a back surface side of the sapphire substrate (with transmitted illumination in which illumination light is irradiated from the back surface side). The optical microscope is focused on a region of the second modified portions 22 inside the substrate 50. The second modified portions 22 formed along and inside the periphery can be observed as shown in FIG. 25.

Second Embodiment

Figure 7A:
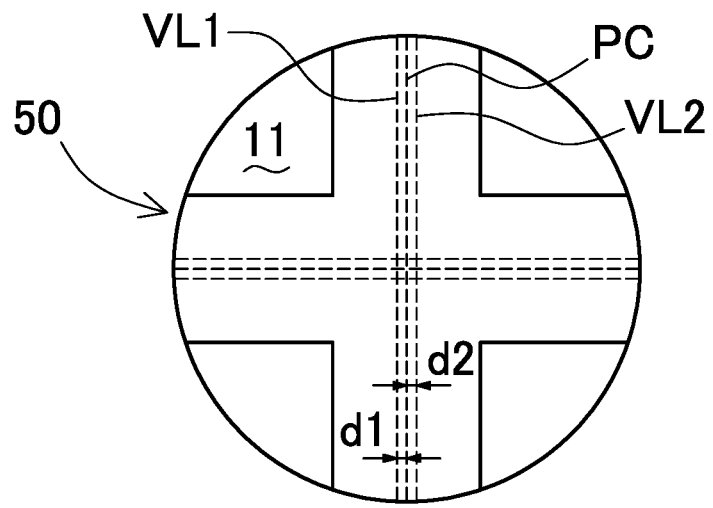
FIG. 7A is a schematic plan view of an irradiation pattern of the laser beam applied to the substrate in a method according to a second embodiment.
Figure 7B:
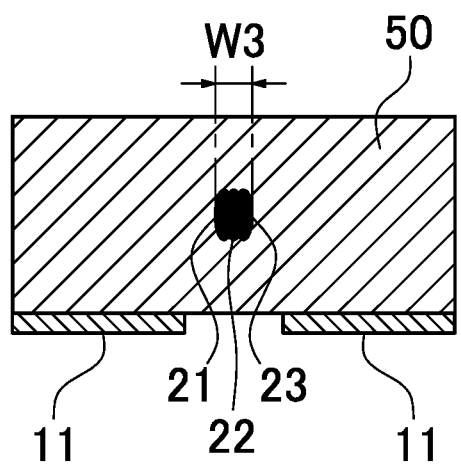
FIG. 7B is a schematic cross-sectional view of the substrate in FIG. 7A.

In the first embodiment described above, two scans with the laser beam are performed at different irradiation positions offset from each other in the in-plane direction of the substrate 50. In the present invention, the scanning with the laser beam may be performed other number of times in a single direction, and may be performed three or more times in a single direction. The schematic plan view of FIG. 7A and the schematic cross-sectional view of FIG. 7B show one example of a method according to a second embodiment in which three scans with the laser beam are performed. As shown in these drawings, after the second irradiation, scans with the laser beam are performed along second predetermined imaginary lines VL2 each of which is offset from a corresponding one of the planned cleavage lines PC in a direction opposite to a corresponding one of the first predetermined imaginary lines VL1 in the in-plane direction of the substrate 50 in a top view of the substrate 50. A third irradiation in this manner forms a plurality of third modified portions 23 on the second predetermined imaginary line VL2 inside the substrate 50 to facilitate development of the cracks CR from the first modified portions 21. With this method, forces produced when the strains caused by formation of the second modified portions 22 and the third modified portions 23 are released act on the cracks CR generated from the first modified portions 21, so that development of the cracks CR can be further facilitated compared with the first embodiment described above. A width W3 of the formed modified region in the second embodiment shown in FIG. 7B is larger than the width W2 of the formed modified region in the first embodiment shown in FIG. 6B. In the example shown in FIGS. 7A and 7B, the first predetermined imaginary line VL1 is located on a left side of the planned cleavage line PC, and the second predetermined imaginary line VL2 is located on a right side of the planned cleavage line PC for the purpose of illustration. It is preferable that the second predetermined imaginary line VL2 is located on either the right side or the left side of the planned cleavage line PC as appropriate according to the conditions of the sapphire substrate or the like as described below.

The output power of the laser beam in the third irradiation is preferably equal to or higher than the output power of the laser beam in the first irradiation. This structure allows for increasing forces produced by release of strains caused when the third modified portions 23 are formed, so that development of cracks from the first modified portions 21 can be easily facilitated. Each of the second predetermined imaginary lines VL2 is preferably 3 µm or more and 7 µm or less offset from a corresponding one of the planned cleavage lines PC. With the offset distance of 3 µm or more of the second predetermined imaginary line VL2 from the planned cleavage line PC in the in-plane direction of the substrate, development of cracks from the first modified portions 21 is efficiently facilitated. With the offset distance of 7 μm or less of the second predetermined imaginary line VL2 from the planned cleavage line PC in the in-plane direction of the substrate, generation of cracks from the third modified portions 23 can be reduced while facilitating development of the cracks CR from the first modified portion 21.

Similarly, each of the first predetermined imaginary lines VL1 is also preferably is 3 μm or more and 7 μm or less offset from a corresponding one of the planned cleavage lines PC. With the offset distance of 3 μm or more of the first predetermined imaginary line VL1 from the planned cleavage line PC in the in-plane direction of the substrate, development of cracks from the first modified portions 21 is efficiently facilitated. With the offset distance of 7 μm or less of the first predetermined imaginary line VL1 from the planned cleavage line PC in the in-plane direction of the substrate, generation of cracks from the second modified portions 22 is reduced while facilitating development of the cracks CR from the first modified portion 21.

The positions in which the laser beam is condensed in the third irradiation are preferably approximately the same in the thickness direction of the substrate 50 as the positions in which the laser beam is condensed in the first irradiation. This structure allows the third modified portions 23 to effectively facilitate the development of the cracks CR from the first modified portion 21 described above.

Third Embodiment

Figure 8A:
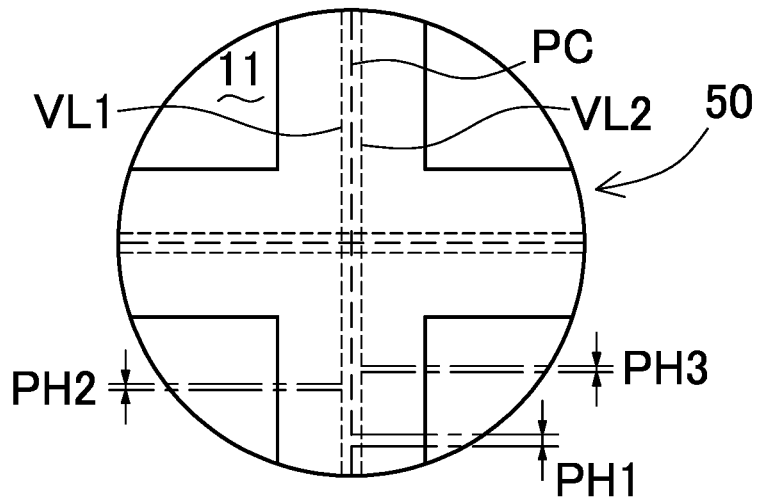
FIG. 8A is a schematic plan view of an irradiation pattern of the laser beam applied to the substrate in a method according to a third embodiment.
Figure 8B:
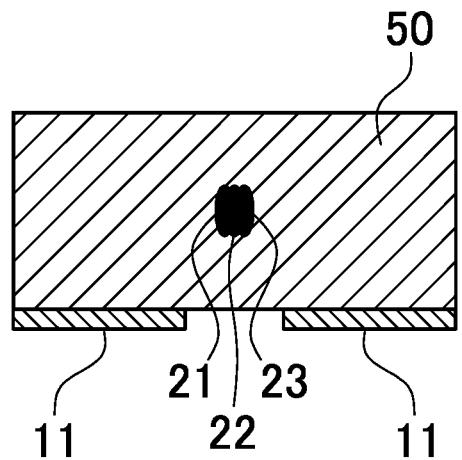
FIG. 8B is a schematic cross-sectional view of the substrate in FIG. 8A.

In the first and second embodiments, examples have been described in each of which scans are performed with a constant irradiation condition of the laser beam LB, without changing the irradiation condition for each scan. The irradiation conditions of the laser beam may be changed for each scan. For example, changing of the pitches of the laser beam for each scan according to a third embodiment will be shown in the schematic plan view of FIG. 8A and the schematic cross-sectional view of FIG. 8B. The expression "pitch of the laser beam" as used herein refers to the distance between adjacent ones of a plurality of condensed portions in which the laser beam is condensed during a scan. In the method shown in FIG. 8A and FIG. 8B, the first irradiation of scanning along the planned cleavage line PC at a first pitch PH1 is performed, and the second irradiation and the third irradiation are then performed on the left and right sides of the planned cleavage line PC at a second pitch PH2 and a third pitch PH3, respectively, smaller than the first pitch PH1. In other words, the first irradiation is performed at the first pitch PH1 larger than the second pitch PH2 and the third pitch PH3. Performing the scans with the laser beam under such irradiation conditions allows for improving the cleavability of the substrate 50. Narrowing the pitches allows more dense formation of the second modified portions 22 and the third modified portions 23, which can increase the forces produced when the strains caused by formation of the second modified portions 22 and the third modified portions 23 are released, so that development of the cracks CR from the first modified portions 21 can be further facilitated, which is thought to cause improvement in cleavability of the substrate 50. While the example shown in FIG. 8A and FIG. 8B described above includes the third irradiation, also when performing only the first irradiation and the second irradiation without the third irradiation, setting the first pitch PH1 of the first irradiation to be larger than the second pitch PH2 of the second irradiation allows for improving the cleavability of the substrate 50.

In the second and third embodiments, the offset distance of the first predetermined imaginary line VL1 in the in-plane direction of the substrate and the pitches in the scans of the laser beam may be different between the second irradiation and the third irradiation.

EXAMPLES 1-2 AND COMPARATIVE EXAMPLES 1-2

To examine the effectiveness of the present invention, substrates 50 of Examples 1 and 2 and Comparative Examples 1 and 2 processed under different irradiation conditions of laser beams were produced, and the results obtained under the respective irradiation conditions of laser beams were evaluated. The irradiation conditions of laser beam in Examples 1 and 2 and Comparative Examples 1 and 2 will be described below.

A sapphire substrate with a thickness of 185 μm was used for each substrate 50 provided with the semiconductor structure 11 on the first main surface 51. The substrate 50 of Comparative Example 1 was processed such that scanning with the laser beam was performed at positions that are the same in the thickness direction of the substrate 50 in the first irradiation and the second irradiation, and the substrate 50 of Example 1 was processed such that scanning with the laser beam was performed at positions that are different in the thickness direction of the substrate 50 between the first irradiation and the second irradiation. Also, the substrate 50 of Comparative Example 2 was processed such that scanning with the laser beam was performed at positions that are the same in the thickness direction of the substrate 50 in the first irradiation, the second irradiation, and the third irradiation, and the substrate 50 of Example 2 was processed such that scanning with the laser beam was performed at positions that are different in the thickness direction of the substrate 50 among the first irradiation, the second irradiation, and the third irradiation. In Example 1, the scanning positions in the thickness direction of the substrate 50 in the second irradiation were the same as those in the first irradiation, while each scanning position being 3 μm offset from a respective one of the scanning positions in the first irradiation in the in-plane direction of the substrate 50. In Example 2, the scanning positions in the thickness direction of the substrate 50 in the second irradiation and the third irradiation were the same as those in the first irradiation, while each scanning position being 3 μm offset from a respective one of the scanning positions in the first irradiation in the in-plane direction of the substrate 50. The irradiation conditions of the laser beam other than the scanning positions in Examples 1 and 2 and Comparative Examples 1 and 2 were the same. The output power of the laser beam was 0.6 W, and the amount of defocus was about 39 μm. The laser beam was applied under pulsed operation, and the pitch was about 6 μm.

Figure 9:
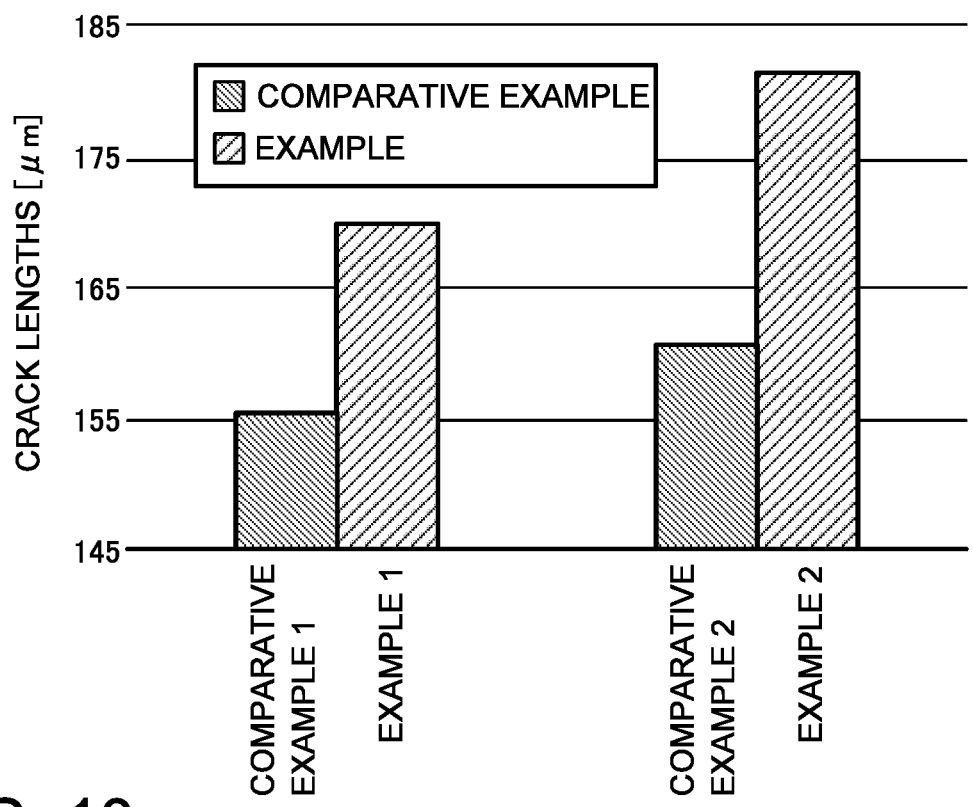
FIG. 9 is a graph showing the measurement results of the lengths of cracks obtained by performing scans with laser beam in methods according to Examples 1 and 2 and Comparative Examples 1 and 2.

The lengths of cracks formed in the substrates 50 of Comparative Examples 1 and 2 and Examples 1 and 2 were measured and compared with each other. FIG. 9 shows the measurement results of Examples 1 and 2 and Comparative Examples 1 and 2.

The measurement results shown in FIG. 9 reveals that the lengths of cracks in the case in which scanning with the laser beam was performed at positions different in the in-plane direction of the substrate 50 between the first irradiation and the second irradiation were longer than the lengths of cracks in the case in which scanning with the laser beam was performed at positions that are the same in the in-plane direction of the substrate 50. That is, it was revealed that the substrate 50 became easy to cleave. As for Example 1 and Comparative Example 1 in each of which two scans with the laser beam were performed, cracks in Example 1 were about 15 µm longer than in Comparative Example 1. As for Example 2 and Comparative Example 2 in each of which three scans with the laser beam were performed, cracks in Example 2 were about 20 µm longer than in Comparative Example 2. Further, comparison between Example 1 and Example 2 revealed that three scans more greatly facilitated development of cracks than two scans. In Comparative Examples 1 and 2, a plurality of modified portions 20 were more densely formed on the planned cleavage lines PC than in Examples 1 and 2 because the same positions were subjected to a plurality of scans with the laser beam. To cleave such a substrate 50 along the planned cleavage line PC, forces required for cleavage of the substrate 50 tend to be larger. Only the first modified portions 21 are formed on the planned cleavage lines PC in Examples 1 and 2, so that forces required for cleavage of the substrates 50 are smaller than in Comparative Examples 1 and 2. It is considered that, in Example 1, development of cracks from the modified portions 20 in the substrate 50 can be facilitated without increasing forces required for cleavage of the substrate 50, so that the substrate 50 in Example 1 can be easily cleaved. Also, it is considered that development of cracks from the modified portions 20 is more greatly facilitated than in Example 1, which allows the substrate 50 in Example 2 to be more easily cleaved without increasing forces required for cleavage of the substrate 50.

EXAMPLES 3-7 AND COMPARATIVE EXAMPLE 3

Further, substrates 50 of Examples 3 to 7 and Comparative Example 3 processed under different irradiation conditions of laser beams were produced, and the results obtained under the respective irradiation conditions of laser beams were evaluated. The irradiation conditions of laser beam in Examples 3 to 7 and Comparative Example 3 will be described below.

Similarly to Examples 1 and 2 and Comparative Examples 1 and 2 described above, a sapphire substrate with a thickness of 185 µm was used for each substrate 50 provided with the semiconductor structure 11 on the first main surface 51. Tests were performed on Examples 3 to 7 and Comparative Example 3 with different offset distances d1 and d2, which were distances of the scanning positions in the second irradiation and the third irradiation, respectively, from the scanning positions in the first irradiation in the in-plane direction of the substrate 50. FIG. 10 and FIG. 11A to FIG. 11F show the results. In each of Example 3 to 7 and Comparative Example 3, the offset distance d1 in the second irradiation was equal to the offset distance d2 in the third irradiation. The offset distances d1 and d2 were 0 µm in Comparative Example 3, 1 µm in Example 3, 3 µm in Example 4, 5 µm in Example 5, 7 µm in Example 6, and 10 µm in Example 7. Then, crack lengths in a cross-section of each substrate 50 were measured. Also, in each of Comparative Example 3, Example 4, and Example 6, optical micrographs of the modified regions formed by the laser beam in a plan view and cross-sections of substrates 50 were observed.

Irradiation conditions of a laser beam machine were set to an output power of the laser beam of 0.6 W, an amount of defocus of 39 µm, and a feed rate of 600 mm/s. The laser irradiation was performed by scanning with the laser beam under pulsed operation.

FIG. 11A to FIG. 11C are plan-view photographs of the modified areas formed inside the respective substrates 50 of Comparative Example 3, Example 4, and Example 6. FIG. 11D to FIG. 11F are photographs of cross-sections of the substrates 50. Among these drawings, FIG. 11A and FIG. 11D show Comparative Example 3, FIG. 11B and FIG. 11E show Example 4, and FIG. 11C and FIG. 11F show Example 6.

Figure 10:
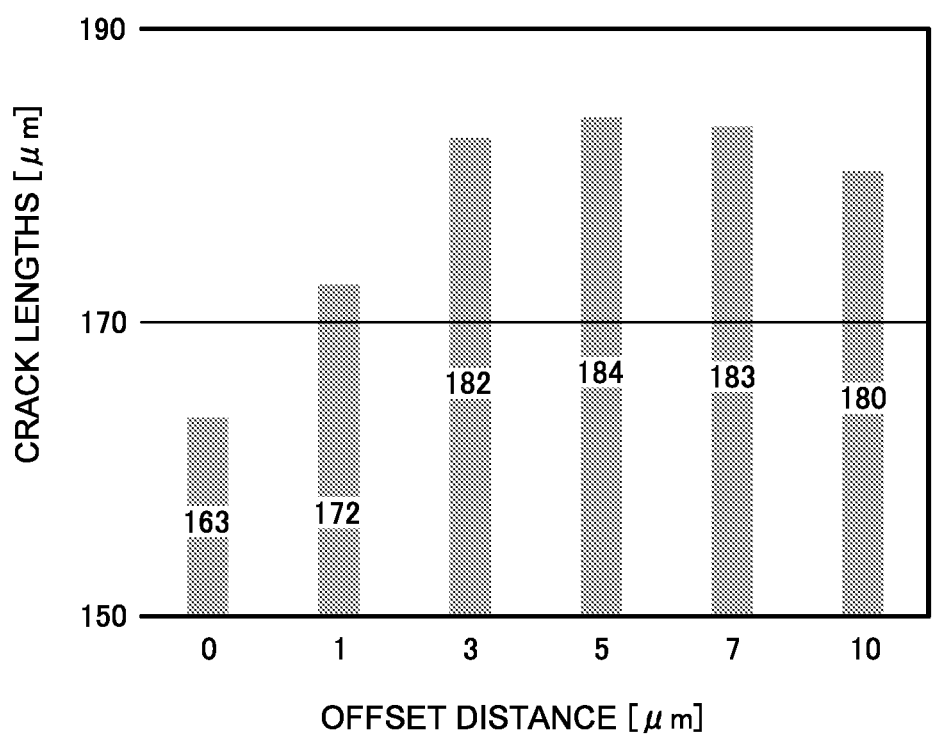
FIG. 10 is a graph of crack lengths with various offset distances of the laser beam in methods according to Examples 3 to 7 and Comparative Example 3.

FIG. 10 is a graph showing difference in crack lengths according to variation in the offset distances d1 and d2. Table 1 shows the conditions of the offset distances d1 and d2 in Comparative Example 3 and Examples 3 to 7 and the measurement results of the crack lengths. As shown in FIG. 10, in Examples 3 to 7 in which the offset distances d1 and d2 were varied within the range of 1 µm or more and 10 µm or less, the effect of lengthening the cracks were confirmed compared with Comparative Example 3 in which the offset distances d1 and d2 were zero, that is, scanning positions are not offset from each other. Also, it was confirmed that, when the offset distances d1 and d2 were 3 µm or more and 7 µm or less, the cracks more efficiently developed than in Comparative Example 3.

TABLE 1

|  | Comparative Example 3 | Example 3 | Example 4 | Example 5 | Example 6 | Example 7 |
| --- | --- | --- | --- | --- | --- | --- |
| d1, d2 [µm] | 0 | 1 | 3 | 5 | 7 | 10 |
| Crack length [µm] | 163 | 172 | 182 | 184 | 183 | 180 |

As shown in FIG. 11D, the crack was so short as to fail to reach a surface of the substrate 50 in Comparative Example 3. On the other hand, it is shown that the cracks developed to reach the surfaces (the first main surface 51 and the second main surface 52) of the substrates 50 in both of Examples 4 and 6 shown in FIG. 11E and FIG. 11F. Accordingly, it was confirmed that the effect of facilitating development of cracks was obtained when the offset distances d1 and d2 were 3 µm or more. Further, the crack in Example 6 shown in FIG. 11F meandered slightly, while a substantially straight linear crack developed in Example 4 shown in FIG. 11E. Accordingly, it was confirmed that the meander of the crack was reduced when the offset distances d1 and d2 were 7 µm or less. Accordingly, the offset distances, which are the distances by which the positions to be irradiated in each of the second and third irradiations are offset from respective corresponding positions to be irradiated in the first irradiation in the in-plane direction, are more preferably 3 µm or more and 7 µm or less.

Next, the pitches of the laser beam in the first irradiation, the second irradiation, and the third irradiation were made different, and the ease of development of cracks from the first modified portions 21 with varying pitches was examined. A scan with the laser beam in the first irradiation was performed along the planned cleavage line PC set to extend along the m-axis direction of the substrate 50 made of sapphire. The substrate 50 had a thickness of 150 µm. The positions to be scanned in the second irradiation and the third irradiation were each offset from the position to be scanned in the first irradiation by 5 µm. The frequency of the laser beam was 75 kHz, and the defocus was 20 µm. The pitch in the first irradiation was 4 µm, and the pitch in each of the second irradiation and the third irradiation was changed to 2 µm, 3 µm, and 4 µm. The pulse energy of the laser beam was changed to 1.8 µJ, 2 µJ, 2.2 µJ, and 2.4 µJ under each set of conditions, and the ease of development of cracks was examined. Under each set of conditions, the pulse energy of the laser beam used in the first irradiation, the second irradiation, and the third irradiation was the same. Table 2 shows the results of examination of development of cracks under each set of conditions. The values with [%] in Table 2 indicate the degrees of development of the cracks in the thickness direction of the substrates obtained by inspection of the photographs of sections of the substrates. For example, the expression "100%" in Table 2 indicates that the crack reached the first main surface 51 and the second main surface 52 of the substrate 50 under that set of conditions.

TABLE 2

| Pitch [µm] | Pulse energy [µJ] | | | |
|---|---|---|---|---|
| | 1.8 | 2 | 2.2 | 2.4 |
| 2.0 | 20% | 100% | — | — |
| 3.0 | 0% | 90% | 100% | — |
| 4.0 | — | — | 30% | 100% |

The results described above show that the pulse energy required for development of cracks increases as the pitch in the second irradiation and the third irradiation increases. Accordingly, it is shown that, with the pitch of the laser beam in the second irradiation and the third irradiation smaller than the pitch of the laser beam in the first irradiation, cracks can be sufficiently developed with further smaller pulse energy. Reduction of the pulse energy required for development of cracks allows for reducing damage to the semiconductor layers caused by laser irradiation.

Fourth Embodiment

Figure 12:
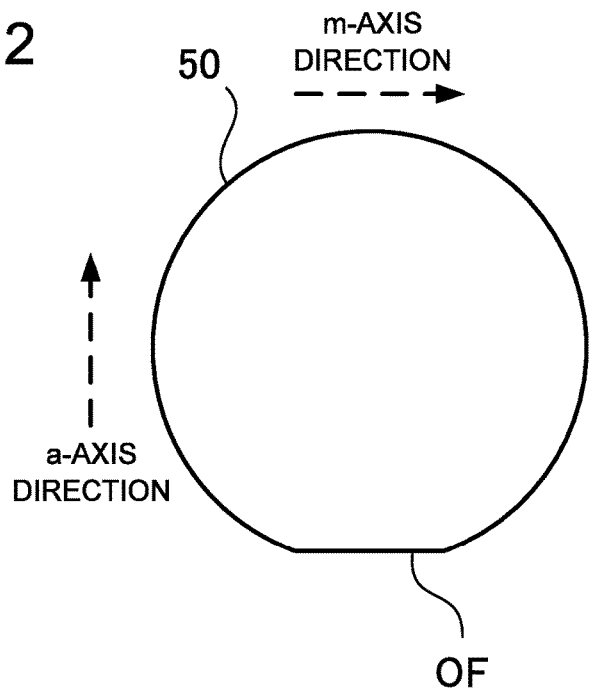
FIG. 12 is a schematic plan view of a substrate with its orientation flat surface corresponding to the horizontal plane.

The first predetermined imaginary line VL1 along which the scan with the laser beam is performed in the second irradiation is set to extend on either the right side or the left side with respect to the planned cleavage line PC according to the positional relationship between the orientation flat surface OF and the planned cleavage line PC in a plan view of the substrate 50 made of sapphire. For example, a case of cleaving the substrate 50 along a planned cleavage line PC in an m-axis direction parallel to the orientation flat surface OF (A-plane) in a plan view with the substrate 50 oriented such that the flat OF is located on a front side as shown in FIG. 12 will be described below. In the description below, for convenience, assuming that the substrate 50 is oriented such that the orientation flat surface OF of the substrate 50 is located at a front side, the front side is defined as a lower side of the substrate 50 in a plan view, and an upper side, a lower side, a right side, and a left side of the substrate 50 in a plan view are defined with respect to the lower side. Even in the case in which the substrate 50 is rotated to change the position of the orientation flat surface OF, the upper, lower, left, right sides in a plan view of the substrate refer to directions before the rotation of the substrate 50. In FIG. 12, the orientation flat surface OF located on the front side is regarded as horizontal, and the angle of the orientation flat surface OF in a plan view is regarded as being 0° in the sense that the orientation flat surface OF corresponds to the horizontal plane.

Figure 13:
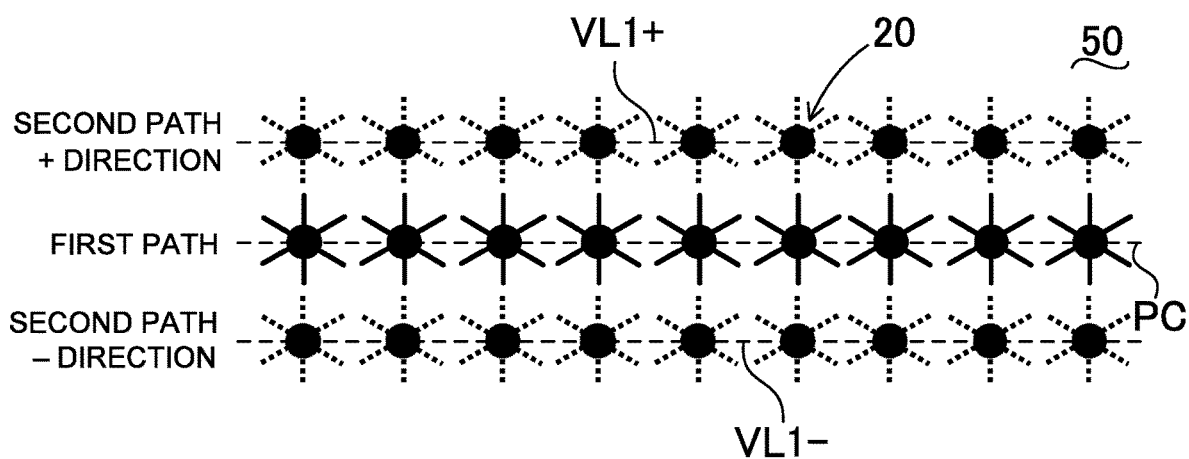
FIG. 13 is a schematic plan view of a plurality of modified portions formed on a planned cleavage line and a plurality of modified portions that are offset from the planned cleavage line in the + direction and the − direction.

FIG. 13 is a schematic plan view of a plurality of modified portions 20 formed by laser irradiation in the substrate 50. As illustrated in FIG. 13, with examining a degree of meander of cracks on the surface of the substrate 50 caused by development of cracks that occurred when a first path of scanning is performed along the planned cleavage line PC, a location of the first predetermined imaginary line VL1 along which a second path of scanning is to be performed is determined whether along a first predetermined imaginary line VL1+ located in a + direction at an upper side of the first predetermined imaginary line VL1 or along a second predetermined imaginary line VL1− located in a − direction at a lower side of the first predetermined imaginary line VL1.

Description on the basis of the schematic perspective views of FIG. 14A and FIG. 14B will be given below. FIG. 14A schematically shows an example in which the first predetermined imaginary line VL1+ serving as the second path is located on the left side of the planned cleavage line PC. FIG. 14B schematically shows an example in which the first predetermined imaginary line VL1—serving as the second path is located on the right side of the planned cleavage line PC. The directions of development of cracks from the second path to the first path formed by the second irradiation in these cases are almost the same, so that there is not much difference in the degree of meandering. FIG. 15A and FIG. 15B are examples of plan-view micrographs of the surface of the substrate 50. The first predetermined imaginary line VL1 serving as the second path is offset from the planned cleavage line PC by +5 µm in FIG. 15A and is offset by −5 µm in FIG. 15B. As shown in these drawings, in the case in which the substrate 50 is to be cleaved in the m-axis direction, the difference in the direction of deviation of the first predetermined imaginary line VL1 from the planned cleavage line PC resulted in little difference in the degree of meandering appearing on the surface of the substrate 50.

Figures 17A, 17B, 17C, 17D:
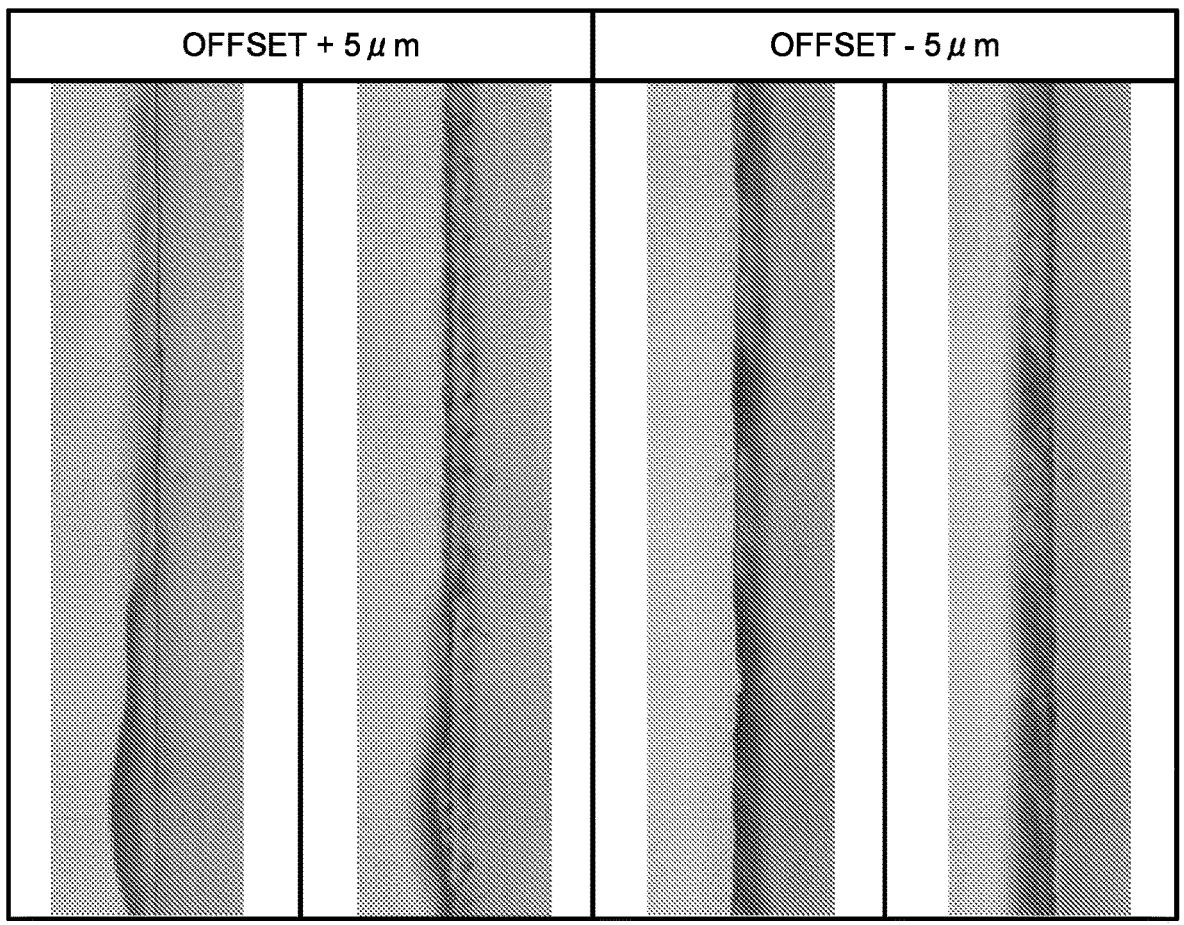
FIG. 17A is a micrograph of an example in which the second path is offset from the first path by 5 μm in the + direction.
FIG. 17B is a micrograph of an example in which the second path is offset from the first path by 5 μm in the + direction.
FIG. 17C is a micrograph of an example in which the second path is offset from the first path by 5 μm in the − direction.
FIG. 17D is a micrograph of an example in which the second path is offset from the first path by 5 μm in the − direction.
Figures 18A, 18B:
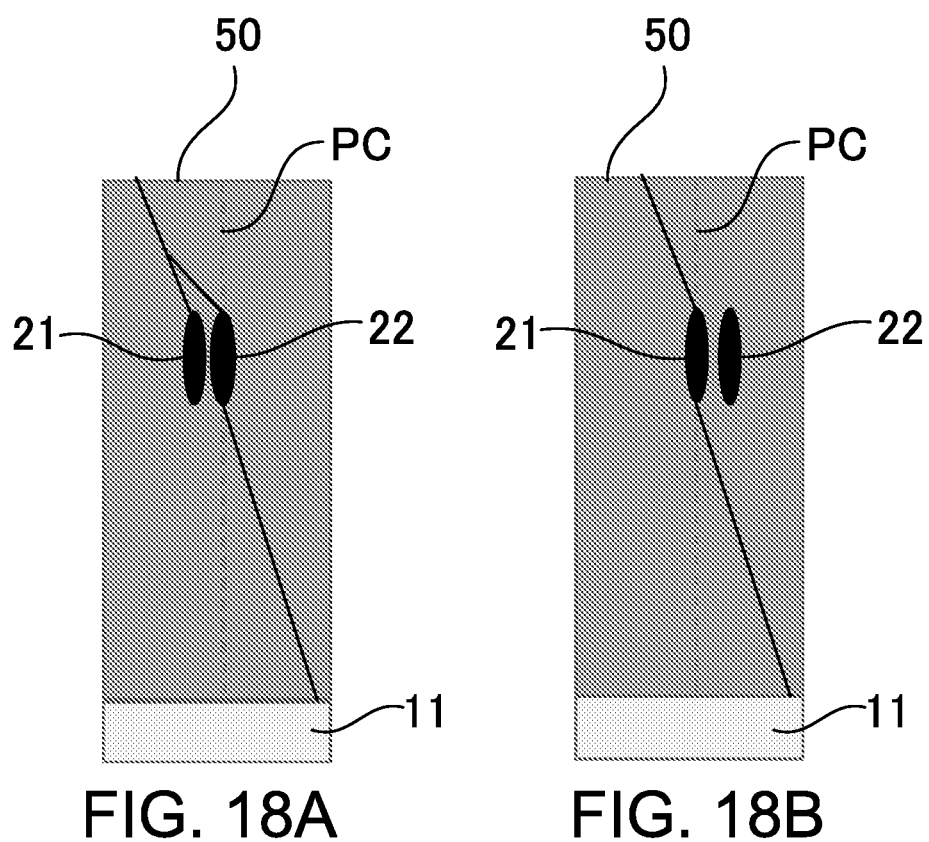
FIG. 18A is a schematic cross-sectional view of a substrate in FIG. 16A.
FIG. 18B is a schematic cross-sectional view of a substrate in FIG. 16B.

The examples in which the substrate 50 is cleaved in the m-axis direction have been described above. Next, examples in which the substrate 50 is cleaved in the a-axis direction are described on the basis of FIG. 16A, FIG. 16B, FIG. 17A to FIG. 17D, FIG. 18A, and FIG. 18B. FIG. 16A is a schematic perspective view of an example in which the first predetermined imaginary line VL1, along which the second path of scanning is performed, is offset from the first path in the + direction on the left side. FIG. 16B is a schematic perspective view of an example in which the first predetermined imaginary line VL1, along which the second path of scanning is performed, is offset from the first path in the − direction on the right side. FIG. 17A and FIG. 17B are plan-view micrographs of examples in each of which the second path is offset from the first path by 5 µm in the + direction. FIG. 17C and FIG. 17D are micrographs of examples in each of which the second path is offset from the first path by 5 µm in the − direction. FIG. 18A is a schematic cross-sectional view of the substrate 50 in FIG. 16A, and FIG. 18B is a schematic cross-sectional view of the substrate 50 in FIG. 16B.

In the case in which the substrate 50 is cleaved in the m-axis direction, the substrate 50 is cleaved in a direction substantially perpendicular to the thickness direction of the substrate 50. Accordingly, it is thought that whether the first predetermined imaginary line VL1 located on the upper or lower side of the planned cleavage line PC in a plan view made approximately no difference in the degree of meandering appearing on the surface of the substrate 50. On the other hand, in the case in which the substrate 50 is cleaved in the a-axis direction, the substrate 50 tends to be cleaved at an angle to the thickness direction of the substrate 50 under the influence of the crystal plane of sapphire. Accordingly, when the second modified portions 22 are formed along the first predetermined imaginary line VL1 serving as the second path offset in the + direction as in a comparative example shown in FIG. 16A, a crack generated from a second modified portion 22 may be connected to a crack generated from a first modified portion 21 as shown in FIG. 18A due to the crack generated from the first modified portion 21 formed along the first path. Such connection of cracks may result in meandering of the cracks appearing on the surface of the substrate 50 in a plan view in a comparative example as shown in FIG. 17A and FIG. 17B. For example, the lower portion in which the crack is not straight and linear but is curved in FIG. 17A and FIG. 17B is the meandering portion.

On the other hand, as shown in FIG. 16B and FIG. 18B illustrating a fourth embodiment, forming the second modified portions 22 along the first predetermined imaginary line VL1 serving as the second path offset in the − direction allows for reducing influence of cracks developing in a slant direction from the first modified portions 21, which are formed along the first path, on cracks generated from the second modified portions 22. For example, when a crack generated from a first modified portion 21 develops toward the second main surface 52 of the substrate 50 as shown in FIG. 18B, the crack develops without passing through a region above the second modified portions 22. A crack generated from a second modified portion 22 is thus inhibited from being connected to the crack generated from the first modified portion 21 as described above, so that the crack appearing on the surfaces of the substrate 50 is inhibited from meandering in a plan view. Accordingly, the crack appearing on the surfaces of the substrate 50 can be inhibited from meandering in a plan view as shown in FIG. 17C and FIG. 17D. Therefore, with the orientation flat surface OF located on the front side, the first irradiation is performed along the planned cleavage line PC set to extend in a direction (a-axis) perpendicular to the orientation flat surface OF (A-plane). After that, the second irradiation is preferably performed along the first predetermined imaginary line VL1 set to extend on the right side of the planned cleavage line PC in a direction perpendicular to the orientation flat surface OF. With this manner, the crack appearing on the surfaces of the substrate 50 can be inhibited from meandering in a plan view when the substrate 50 is cleaved.

Fifth Embodiment

In the fourth embodiment, preferable settings of the first predetermined imaginary line VL1 have been examined in the case in which the substrate 50 is cleaved in the m-axis direction and the a-axis direction with the substrate 50 oriented such that the angle between the orientation flat surface OF and the horizontal plane is 0° as shown in FIG. 12. In a fifth embodiment, preferable settings of the first predetermined imaginary line VL1 will be examined in the case in which the substrate 50 is cleaved in the up/down and left/right directions with the substrate 50 oriented such that the angle between the orientation flat surface OF and the horizontal plane is 45° as shown in FIG. 19.

FIG. 20A and FIG. 20C are schematic plan views of a plurality of modified portions 20 formed by performing scans with the laser beam in the left/right direction with the substrate 50 oriented such that the orientation flat surface OF is at an angle of 45° relative to the horizontal plane as shown in FIG. 19. FIG. 20A schematically shows the state where a scan with the laser beam under pulsed operation has been performed in the direction from left to right indicated by the arrow in the drawing. FIG. 20C schematically shows the state where a scan with the laser beam under pulsed operation has been performed in the direction from right to left indicated by the arrow in the drawing. FIG. 20B is a micrograph of a substrate subjected to the scan shown in FIG. 20A, and FIG. 20D is a micrograph of a substrate subjected to the scan shown in FIG. 20C. As shown in these drawings, as a result of the scans with the laser beam, cracks that are formed opposite to an advancing direction of scanning of the laser beam and are closest to the scanning line tend to most greatly develop among a plurality of cracks developing from the modified portions 20. FIG. 20A shows a plurality of cracks (straight lines) developing from modified portions 20 such that, among a plurality of cracks developing from each modified portion 20, the crack that most greatly develops is illustrated to be longer than the other cracks. This tendency is attributable to that the scan with the laser beam is not performed along the m-axis direction or the a-axis direction of the substrate 50. Accordingly, for the second irradiation performed after the first modified portions 21 are formed along the planned cleavage line PC, the position of the first predetermined imaginary line VL1 and the scanning direction of the laser beam are preferably selected in consideration of development of cracks from the first modified portions 21.

FIG. 21A is a schematic plan view showing development of cracks generated by performing a scan with the laser beam from right to left along the planned cleavage line PC serving as the first path and a subsequent scan with the laser beam from left to right along the first predetermined imaginary line VL1 serving as the second path and being offset an upward from the planned cleavage line PC. In the case in which such scans with the laser beam as shown in FIG. 21A have been performed, the crack that have more greatly developed than other cracks among the cracks generated from each of the second modified portions 22 formed along the second path is located near the crack that have more greatly developed than other cracks among the cracks generated from a corresponding one of the first modified portions 21 formed along the first path. Accordingly, the cracks generated from the first modified portions 21 are connected to the cracks generated from the second modified portions 22, so that the crack appearing on the surface of the substrate 50 tends to meander in a plan view.

FIG. 21B is a schematic plan view showing development of cracks caused by performing a scan with the laser beam from right to left along the planned cleavage line PC serving as the first path and a subsequent scan with the laser beam from left to right along the first predetermined imaginary line VL1 serving as the second path with a downward offset from the planned cleavage line PC. In the case in which such scans with the laser beam as shown in FIG. 21B have been performed, a crack that most greatly develops among the cracks generated from each of the second modified portions 22 that are formed along the second path develops in the direction opposite to the direction of development of a crack that most greatly develop among the cracks generated from each of the first modified portions 21 that are formed along the first path. FIG. 20C shows a plurality of cracks (straight lines) developing from modified portions 20 such that, among the plurality of cracks from each modified portion 20, the crack that most greatly develops is illustrated to be longer than the other cracks. With such scanning, the longest crack among the cracks generated from each of the first modified portions 21 and the longest crack among the cracks generated from a corresponding one of the second modified portions 22 are unlikely to be connected to each other. Such reduction of connection between the cracks allows for inhibiting the cracks appearing on the surface of the substrate 50 from meandering in a plan view.

Therefore, in the case in which the substrate 50 disposed such that the orientation flat surface OF is located on the front side is rotated 45° counterclockwise, the scanning to perform the first irradiation is performed such that the laser beam is scanned along the planned cleavage line PC set to extend in the left-right direction in a first advancing direction from the right side to the left side in a plan view. After that, the scanning to perform the second irradiation is preferably performed such that the laser beam is scanned along the first predetermined imaginary line VL1 set to extend on a lower side with respect to the planned cleavage line PC in a second advancing direction from the left side to the right side in a plan view.

While the case in which the substrate 50 is cleaved in the left/right direction has been described above, the second irradiation arranged in consideration of the cracks generated from the first modified portions 21 is preferably performed in substantially the same manner also in the case of cleavage in the up/down direction. That is, in the case in which the substrate 50 disposed such that the orientation flat surface OF is located on the front side is rotated 45° counterclockwise, the scanning to perform the first irradiation is performed such that the laser beam is scanned in a first advancing direction from the lower side to the upper side along the planned cleavage line PC set to extend in the upper-lower direction in a plan view. After that, the scanning to perform the second irradiation is preferably performed such that the laser beam is scanned along the first predetermined imaginary line VL1 set to extend on the right side with respect to the planned cleavage line PC in a second advancing direction from the upper side to the lower side in a plan view. With this arrangement, similarly to the case described above, connection between a crack developing from each of the modified portions formed along the first path and a crack developing from a corresponding one of the modified portions formed along the second path can be reduced, and the crack appearing on the surface of the substrate 50 can be inhibited from meandering in a plan view.

While the case in which the first advancing direction of the first path is defined as a direction from the right side to the left side has been described above, the first advancing direction may be defined as a direction from the left side to the right side. In this case, the second irradiation with the laser beam is performed along the first predetermined imaginary line VL1 set to extend on the upper side with respect to the planned cleavage line PC in a second advancing direction from the right side to the left side in a plan view. Further, while the case in which the first advancing direction of the first path is defined as a direction from the lower side to the upper side in a plan view has also been described above, the first advancing direction may be defined as a direction from the upper side to the lower side in a plan view. In this case, the second irradiation with the laser beam is performed along the first predetermined imaginary line VL1 set to extend on the left side with respect to the planned cleavage line PC in a second advancing direction from the lower side to the upper side in a plan view. Also with this arrangement, similarly to the case described above, connection between a crack developing from a corresponding one of the modified portions formed along the first path and a crack developing from a corresponding one of the modified portions formed along the second path can be reduced, so that the crack appearing on the surface of the substrate 50 can be inhibited from meandering in a plan view.

In the description above, certain embodiments of a method of manufacturing a light emitting element are described. However, the present invention is not limited the description above, and should be broadly construed on the basis of the claims. The present invention also encompasses variations and modifications that are made on the basis of the description above.

What is claimed is:

1. A method of manufacturing a light-emitting element, the method comprising:
    condensing a laser beam inside a substrate provided with a semiconductor structure to form a plurality of modified portions including a plurality of first modified portions and a plurality of second modified portions, the condensing the laser beam comprising:
    scanning the substrate with a laser beam along a predetermined planned cleavage line to perform first irradiation to form the plurality of first modified portions located on the planned cleavage line inside the substrate and cracks generated from the first modified portions;
    after the first irradiation, scanning the substrate with a laser beam along a first predetermined imaginary line that is parallel to the planned cleavage line in a top view and is offset from the planned cleavage line in an in-plane direction of the substrate by a predetermined distance to perform second irradiation to form the plurality of second modified portions located on the first predetermined imaginary line inside the substrate to facilitate development of the cracks generated from the first modified portions; and
    after the condensing the laser beam, cleaving the substrate starting from the plurality of first modified portions,
    wherein a pitch of the laser beam in the second irradiation is smaller than a pitch of the laser beam in the first irradiation.

2. The method of manufacturing a light-emitting element according to claim 1, wherein an output power of the laser beam in the second irradiation is equal to or higher than an output power of the laser beam in the first irradiation.

3. The method of manufacturing a light-emitting element according to claim 1, wherein the first predetermined imaginary line is offset from the planned cleavage line by 3 µm or more and 7 µm or less.

4. The method of manufacturing a light-emitting element according to claim 1, wherein the laser beam in the second irradiation is condensed at a same position as the laser beam in the first irradiation in a thickness direction of the substrate.

5. The method of manufacturing a light-emitting element according to claim 1, wherein the substrate is made of sapphire.

6. The method of manufacturing a light-emitting element according to claim 1,
    wherein the condensing the laser beam inside the substrate is performed such that the plurality of modified portions further includes a plurality of third modified portions, and
    wherein the method further comprises, between the scanning to perform the second irradiation and the cleaving the substrate, scanning the substrate with a laser beam along a second predetermined imaginary line offset from the planned cleavage line in the in-plane direction of the substrate by a predetermined distance in the top view, the second predetermined imaginary line set to extend on a side opposite to the first predetermined imaginary line across the planned cleavage line to perform a third irradiation, to form the plurality of third modified portions located on the second predetermined imaginary line inside the substrate.

7. The method of manufacturing a light-emitting element according to claim 6, wherein an output power of the laser beam in the third irradiation is equal to or higher than an output power of the laser beam in the first irradiation.

8. The method of manufacturing a light-emitting element according to claim 6, wherein the second predetermined imaginary line is offset from the planned cleavage line by 3 µm or more and 7 µm or less.

9. The method of manufacturing a light-emitting element according to claim 6, wherein the laser beam in the third irradiation is condensed at a same position as the laser beam in the first irradiation in a thickness direction of the substrate.

10. The method of manufacturing a light-emitting element according to claim 1, wherein a thickness of the substrate is 100 µm or more and 300 µm or less.

11. A method of manufacturing a light-emitting element, the method comprising:
   condensing a laser beam inside a substrate provided with a semiconductor structure to form a plurality of modified portions including a plurality of first modified portions and a plurality of second modified portions, the condensing the laser beam comprising:
   scanning the substrate with a laser beam along a predetermined planned cleavage line to perform first irradiation to form the plurality of first modified portions located on the planned cleavage line inside the substrate and cracks generated from the first modified portions;
   after the first irradiation, scanning the substrate with a laser beam along a first predetermined imaginary line that is parallel to the planned cleavage line in a top view and is offset from the planned cleavage line in an in-plane direction of the substrate by a predetermined distance to perform second irradiation to form the plurality of second modified portions located on the first predetermined imaginary line inside the substrate to facilitate development of the cracks generated from the first modified portions; and
   after the condensing the laser beam, cleaving the substrate starting from the plurality of first modified portions,
   wherein the substrate is made of sapphire,
   wherein the substrate has an approximately circular shape in a plan view, and has an orientation flat surface parallel to an A-plane of the substrate in a portion of a periphery of the substrate,
   wherein, when the substrate is oriented such that the orientation flat surface is located at a front side, the front side is defined as a lower side of the substrate in the plan view, and an upper side, a lower side, a right side, and a left side of the substrate in the plan view are defined with respect to the lower side of the substrate in the plan view,
   wherein, with the substrate rotated 45° counterclockwise relative to the state where the orientation flat surface is located on the front side, the scanning to perform the first irradiation is performed such that the laser beam is scanned in a first advancing direction from the right side to the left side along the planned cleavage line set to extend in a left-right direction in the plan view, and
   wherein, after the scanning to perform the first irradiation, the scanning to perform the second irradiation is performed such that the laser beam is scanned in a second advancing direction from the left side to the right side along the first predetermined imaginary line set to extend on a lower side with respect to the planned cleavage line in the plan view.

12. The method of manufacturing a light-emitting element according to claim 11, wherein the first predetermined imaginary line is offset from the planned cleavage line by 3 µm or more and 7 µm or less.

13. The method of manufacturing a light-emitting element according to claim 11, wherein the laser beam in the second irradiation is condensed at a same position as the laser beam in the first irradiation in a thickness direction of the substrate.

14. The method of manufacturing a light-emitting element according to claim 11, wherein an output power of the laser beam in the second irradiation is equal to or higher than an output power of the laser beam in the first irradiation.

15. A method of manufacturing a light-emitting element, the method comprising:
   condensing a laser beam inside a substrate provided with a semiconductor structure to form a plurality of modified portions including a plurality of first modified portions and a plurality of second modified portions, the condensing the laser beam comprising:
   scanning the substrate with a laser beam along a predetermined planned cleavage line to perform first irradiation to form the plurality of first modified portions located on the planned cleavage line inside the substrate and cracks generated from the first modified portions;
   after the first irradiation, scanning the substrate with a laser beam along a first predetermined imaginary line that is parallel to the planned cleavage line in a top view and is offset from the planned cleavage line in an in-plane direction of the substrate by a predetermined distance to perform second irradiation to form the plurality of second modified portions located on the first predetermined imaginary line inside the substrate to facilitate development of the cracks generated from the first modified portions; and
   after the condensing the laser beam, cleaving the substrate starting from the plurality of first modified portions,
   wherein the substrate is made of sapphire,
   wherein the substrate has an approximately circular shape in a plan view, and has an orientation flat surface parallel to an A-plane of the substrate in a portion of a periphery of the substrate,
   wherein, when the substrate is oriented such that the orientation flat surface is located at a front side, the front side is defined as a lower side of the substrate in the plan view, and an upper side, a lower side, a right side, and a left side of the substrate in the plan view are defined with respect to the lower side of the substrate in the plan view,
   wherein, with the substrate rotated 45° counterclockwise relative to the state where the orientation flat surface is located on the front side, the scanning to perform the first irradiation is performed such that the laser beam is scanned in a first advancing direction from the lower side to the upper side along the planned cleavage line set to extend in an upper-lower direction in the plan view, and
   wherein, after scanning to perform the first irradiation, the scanning to perform the second irradiation is performed such that the laser beam is scanned in a second advancing direction from the upper side to the lower side along the first predetermined imaginary line set to extend on a right side with respect to the planned cleavage line in the plan view.

16. The method of manufacturing a light-emitting element according to claim 15, wherein an output power of the laser beam in the second irradiation is equal to or higher than an output power of the laser beam in the first irradiation.

17. The method of manufacturing a light-emitting element according to claim 15, wherein the first predetermined imaginary line is offset from the planned cleavage line by 3 µm or more and 7 µm or less.

18. The method of manufacturing a light-emitting element according to claim 15, wherein the laser beam in the second irradiation is condensed at a same position as the laser beam in the first irradiation in a thickness direction of the substrate.

19. A method of manufacturing a light-emitting element, the method comprising:
  condensing a laser beam inside a substrate provided with a semiconductor structure to form a plurality of modified portions including a plurality of first modified portions and a plurality of second modified portions, the condensing the laser beam comprising:
  scanning the substrate with a laser beam along a predetermined planned cleavage line to perform first irradiation to form the plurality of first modified portions located on the planned cleavage line inside the substrate and cracks generated from the first modified portions;
  after the first irradiation, scanning the substrate with a laser beam along a first predetermined imaginary line that is parallel to the planned cleavage line in a top view and is offset from the planned cleavage line in an in-plane direction of the substrate by a predetermined distance to perform second irradiation to form the plurality of second modified portions located on the first predetermined imaginary line inside the substrate to facilitate development of the cracks generated from the first modified portions; and
  after the condensing the laser beam, cleaving the substrate starting from the plurality of first modified portions,
  wherein the substrate is made of sapphire,
  wherein the substrate has an approximately circular shape in a plan view, and has an orientation flat surface parallel to an A-plane of the substrate in a portion of a periphery of the substrate,
  wherein, when the substrate is oriented such that the orientation flat surface is located at a front side, the front side is defined as a lower side of the substrate in the plan view, and an upper side, a lower side, a right side, and a left side of the substrate in the plan view are defined with respect to the lower side of the substrate in the plan view,
  wherein the first irradiation is performed along the planned cleavage line perpendicular to the orientation flat surface with the orientation flat surface located on the front side, and
  wherein, after the first irradiation, the second irradiation is performed along the first predetermined imaginary line set to extend on the right side with respect to the planned cleavage line and to be perpendicular to the orientation flat surface.

20. The method of manufacturing a light-emitting element according to claim 19, wherein an output power of the laser beam in the second irradiation is equal to or higher than an output power of the laser beam in the first irradiation.

21. The method of manufacturing a light-emitting element according to claim 19, wherein the first predetermined imaginary line is offset from the planned cleavage line by 3 µm or more and 7 µm or less.

22. The method of manufacturing a light-emitting element according to claim 19, wherein the laser beam in the second irradiation is condensed at a same position as the laser beam in the first irradiation in a thickness direction of the substrate.

\* \* \* \* \*